(12) United States Patent
Brownlow et al.

(10) Patent No.: US 6,232,946 B1
(45) Date of Patent: May 15, 2001

(54) ACTIVE MATRIX DRIVE CIRCUITS

(75) Inventors: Michael James Brownlow, Sandford on Thames; Graham Andrew Cairns, Cutteslowe; Andrew Kay, Oxford, all of (GB)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/055,083

(22) Filed: Apr. 3, 1998

(30) Foreign Application Priority Data

Apr. 4, 1997 (GB) .................................................. 9706943

(51) Int. Cl.⁷ ....................................................... G09G 3/36
(52) U.S. Cl. .............................................. 345/98; 345/100
(58) Field of Search .................................. 345/89, 98, 99, 345/100, 147, 204, 205, 206; 327/94, 95, 96, 100, 427

(56) References Cited

U.S. PATENT DOCUMENTS

| 4,306,196 | 12/1981 | Dwarakanath et al. | 330/9 |
| 4,439,693 | 3/1984 | Lucas et al. | 333/9 |
| 5,170,158 | 12/1992 | Shinya et al. | 345/98 |

(List continued on next page.)

FOREIGN PATENT DOCUMENTS

| 6222733 | 8/1994 | (JP) . |
| 8278771 | 10/1996 | (JP) . |

OTHER PUBLICATIONS

A. G. Lewis et al., Journal of the Society for Information Display 1995, pp. 56–64, 1995, "Driver Circuits for AML-CDs".

C. Reita, Displays, vol. 14, No. 2, pp. 104–114, 1993, "Integrated Driver Circuits for Active Matrix Liquid Crystal Display".

Y. Matsueda et al., SID 96 Digest, pp. 21–24, 1996, "Low–Temperature Poly–Si TFT–LCD With Integrated 6–bit Digital Data Drivers".

S. N. Lee et al., 1990 IEEE International Solid–State Circuits Conference, pp. 220–221, 1990, "A 5 X 9 Inch Polysilicon Gray–Scale Color Head Down Display Chip".

Search Report for Application No. GB 9706943.9; Dated Jun. 25, 1997.

G. A. Cairns et al., U.S. Pending Application Serial No. 09/054,949, Filed on Apr. 3, 1998.

*Primary Examiner*—Steven Saras
*Assistant Examiner*—Paul A. Bell
(74) *Attorney, Agent, or Firm*—Renner, Otto, Boisselle & Sklar LL

(57) ABSTRACT

A data line driver circuit for an active matrix liquid crystal display comprises a distributed controller in the form of a control shift register comprising a chain of control DFF's and associated detection logic. Furthermore the drive circuit includes a respective driver stage under the control of each control DFF for sampling the n-bit digital input signal and for supplying a drive signal to a corresponding data line. Each of the driver stages incorporates an n-bit vertically connected sample shift register composed of DFF's and associated 2:1 multiplexers which are used to provide an input either from the relevant bit line of the n-bit input data bus or from the output of the preceding DFF. In operation the n-bits of the input signal are supplied in parallel to the n inputs of the DFF's in a sampling mode, and the n-bits are shifted along the sample shift register towards the output of the shift register in a shifting mode. A serial D/A converter receives the n-bits sequentially and produces an analogue drive signal for driving the data line.

17 Claims, 20 Drawing Sheets

U.S. PATENT DOCUMENTS

| | | | |
|---|---|---|---|
| 5,192,945 | * 3/1993 | Kusada | 345/100 |
| 5,251,051 | 10/1993 | Fujiyoshi et al. | 359/85 |
| 5,453,757 | 9/1995 | Date et al. | 345/89 |
| 5,457,415 | 10/1995 | Schlig | 327/94 |
| 5,523,772 | * 6/1996 | Lee | 345/98 |
| 5,745,093 | * 4/1998 | Tsuzuki et al. | 345/208 |
| 5,751,279 | * 5/1998 | Okumura | 345/204 |
| 5,818,413 | * 10/1998 | Hayashi et al. | 345/100 |
| 5,856,816 | * 1/1999 | Youn | 345/98 |
| 5,999,158 | * 12/1999 | Sekido et al. | 345/98 |
| 6,046,719 | * 4/2000 | Dingwall | 345/100 |

* cited by examiner

ACTIVE MATRIX DRIVE CIRCUITS

BACKGROUND OF THE INVENTION

1. Field of the Invention

This invention relates to active matrix drive circuits and is concerned more particularly, but not exclusively, with drive circuits for active matrix liquid crystal displays (AMLCD'S).

The invention can be applied, for example, to drive circuits for driving matrix-addressed grey-scale thin-film display panels, such as AMLCD'S, with digital data, and can be implemented in a compact and area efficient manner. The circuit can be constructed with conventional large scale integration (LSI) to form chip-on-glass (COG) data drive circuits, although the circuit offers particularly significant advantages in terms of area efficiency when implemented using thin-film transistors (TFT) integrated on the display substrate.

2. Description of the Related Art

FIG. 1 shows a typical AMLCD 1 composed of N rows and M columns of pixels addressable by scan lines 2 connected to a scan line driver circuit 3 and data lines 4 connected to a data line driver circuit 5. Data voltages are applied to the data lines 4 by the data line driver circuit 5 and scan voltages are applied to the scan lines 2 by the scan line driver circuit 3 so that such voltages in combination serve to apply analogue data voltages to the pixel electrodes 6 (as best seen in the enlarged detail of the display in the lower half of the figure) in order to control the optical transmission states of the pixels along each row as the rows are scanned in a cyclically repeating sequence. This is achieved as follows for a single row of pixels. The data line driver circuit 5 reads serial analogue or digital data to be displayed by the row of pixels, and applies parallel analogue data voltages to the data lines 4 so as to charge up each data line 4 to the required data voltage. The scan line 2 corresponding to the row of pixels to be controlled is activated by the application of the scan voltage by the scan line driver circuit 3 so that a TFT 7 associated with each pixel is switched on to transfer charge from the corresponding data line 4 to a pixel storage capacitance 8 (as shown in broken lines in the figure) associated with the pixel. When the scan voltage is removed the TFT 7 isolates the pixel storage capacitance 8 from the data line 4 so that the optical transmission state of the pixel corresponds to the voltage across the pixel storage capacitance 8 until the pixel is refreshed during the next scanning frame. The rows of pixels are refreshed one at a time until all the rows have been refreshed to complete refreshing of a frame of display data. The process is then repeated for the next frame of data.

The data line driver circuit 5 for such a display can be implemented using conventional LSI and bonded to the periphery of the display using COG techniques, or alternatively the circuit can be fabricated monolithically on the display substrate using polysilicon TFT circuitry. However, since the data line driver circuit 5 of such a display requires more sophisticated circuitry than the scan line driver circuit 3, it will be apparent that it is the form of circuit used for the data line drive which will have the more significant impact on the viability of implementing the drive electronics using monolithic low performance TFT circuitry.

The most straightforward driving scheme for such a display is the point-at-a-time driving scheme, and FIG. 2 shows an analogue data line driver circuit 10 which may be employed in such a driving scheme. In this circuit 10 a shift register composed of a chain of D-type flip-flops 11 is connected so that the output of each flip-flop 11 controls the gate of an associated sampling transistor 12 for sampling the analogue video input signal AVIDEO and for applying the sampled signal to the corresponding data line 4 with its associated parasitic capacitance, shown in broken lines at 13 in the figure. For a colour display there are three analogue video lines, one for each RGB signal. In operation frame and line synchronisation pulses VSYNC and HSYNC indicate the start of a frame period and a line period respectively, and a clock signal CK at the sampling frequency is applied to the clock inputs of the flip-flops 11 so that a circulating "1" state within the shift register sequentially activates the sampling transistors 12 at the sampling frequency. The RC time constant formed by the on resistance of the sampling transistor 12 and the resistance and distributed capacitance of the data line 4 must be sufficiently less than the available sampling period (1/fNM) for the sampling to be executed successfully.

FIG. 4a is a timing diagram showing the timing of the signals associated with such a point-at-a-time data line driver circuit 10, where S1, S2 and S3 refer to the scan voltages applied to the first three scan lines numbered from the top of the display. It will be noted that the AVIDEO signal is sampled at the same time as application of the data voltages to the pixels on activation of the scan lines in successive scanning line periods T1, T2 . . . by the scan voltages S1, S2, S3, such scan voltages being synchronised by the HSYNC pulses. In order to increase the length of the sampling window, it is possible to use multiple phase timing registers which sample a multiphase analogue input signal. However a realistic limit of four phases restricts the point-at-a-time driving scheme to relatively small displays having low capacitance data lines, or alternatively low resolution displays having a slow data rate.

For analogue displays of large size or high, pixel resolution, in which the RC time constant of the data lines is larger than the available sampling window for the point-at-a-time driving scheme, it is necessary for a line-at-a-time driving scheme to be used instead, and FIG. 3a shows an analogue data line driver circuit 20 which may be employed in such a driving scheme. In this circuit 20 a shift register composed of a chain of D-type flip-flops 21 is connected so that the output of each flip-flop 21 controls an associated sampling circuit 22 for sampling the AVIDEO signal and applying the sampled signal to the corresponding data line 4 with its associated parasitic capacitance, shown in broken lines at 23 in the figure. As shown in the enlarged detail of FIG. 3b, each of the sampling circuits 22 supplied with control signals by a control circuit 24 comprises two control gates 25 and 26, two small storage capacitors 27 and 28, and a buffer 29. In each case the capacitor 27 or 28 is employed to store a sample of the AVIDEO signal, and the voltage on each capacitor is then transferred to the data line by the buffer 29. Two storage capacitors 27 and 28 are normally sued since the sampling of the serial input data and the driving of the data lines cannot take place simultaneously. While the capacitor 27 is being used for sampling, the capacitor 28 and the buffer 29 are driving the data line. During the next line period, the capacitor 27 and buffer 29 are used to drive the data line, whilst the capacitor 28 is used for the next line sample. Thus, at any one instant, a whole line of video data is stored in the analogue memory consisting of the capacitors 27 and 28.

FIG. 4b is a timing diagram showing the timing of the signals associated with such a line-at-a-time data line driver circuit 20, for comparison with the point-at-a-time timing diagram of FIG. 4a. the important feature of the line-at-a- time driving scheme is that the scan line is activated only after a complete line of data has been sampled during line period T1, the next complete line period T2 being used for scanning of the data to the pixels as well as sampling of the data for the row of pixels (as opposed to the point-at-a-time driving scheme of FIG. 4a where sampling and scanning occur in each of the line periods T1 and T2). However the implementation of the line memory and buffering incurs a significant overhead both in terms of numbers of components and drive circuit complexity.

There is an increasing trend within the field of active matrix displays to adopt a digital interface to the external video source. Such a digital interface is in general more robust to noise and offers considerable simplifications in terms of system design. Digital data line driver circuits normally use a line-at-a-time driving scheme and require a line memory, and a number of such circuits are disclosed by A. Lewis, "Driver circuits for AMLCD's", Journal, pages 56–64, 1993 and C. Reita, "Integrated driver circuits for active matrix liquid crystal displays", Displays, Vol. 14(2), pages 104–114, 1993. FIG. 5 shows a typical digital data line driver circuit 30 comprising an input register 31 in the form of a first row of n-bit digital latches constituting a line memory, a storage register 32 in the form of a second row of n-bit digital latches, and a row of digital-to-analogue (D/A) converters 33 for applying voltages to the data lines 4 by way of output buffers 34. The input register 31 is used to sample the n-bit parallel input data under control of a timing register 35 supplied with control signals. Once a line of data has been loaded into the input register 31, the data is transferred to the storage register 32 to enable digital-to-analogue conversion to be effected by the D/A converters 33, leaving the input register 31 free to concurrently sample a new line of data. The use of the two registers 31 and 32 provides a pipeline delay equal to one line period during which the digital-to-analogue conversion and line driving can take place.

Within this basic framework, the differences between the various known drive circuits principally relate to the method of D/A conversion and line driving. FIG. 6 shows the simplest type of D/A converter which is in the form of an unbuffered parallel switched capacitor array, as disclosed by, for example, Y. Matsueda, S. Inoue, S. Takenaka, T. Ozawa, S. Fujikawa, T. Nakazawa and H. Ohschima, "Low temperature poly-Si TFT-LCD with integrated 6-bit digital data drivers", Society for information Display 96 Digest, pages 21–24, and U.S. Pat. No. 5,251,051. In this circuit each D/A converter 33 comprises an array of n capacitors 36 and associated switches 37, the capacitors 36 having binary weighted capacitances Co, 2Co . . . $2^{n-1}$Co. The capacitors 36 are charged to a reference voltage in accordance with the digital data and subsequently connected directly to the data lines 4 by transfer switches 38. There are a number of drawbacks with this approach, including the area required for the capacitor array and digital storage and also the limitation on line capacitance and hence display panel size. Since the line capacitance is driven purely by charge sharing, it is apparent that this type of circuit is only suitable for relatively small displays.

In order to drive the capacitative loads associated with displays of larger size or higher resolution, it is possible to add a buffer between the binary weighted capacitor array and the line capacitance, as disclosed in U.S. Pat. No. 5,453,757. FIG. 7 shows an example of this type of converter, as disclosed by A. Lewis, "Driver circuits for AMLCD's", Journal, pages 56–64, 1993. In this case a buffer amplifier 39 and large feedback capacitor 40 are required for each converter 33, and this further increases the area required for implementation of the converter 33. Furthermore the feedback capacitor 40 is generally made equal to the sum of the input capacitance in the binary array and thus the buffer amplifier 39 has a significant load to drive.

The large area overhead of such parallel switched capacitor D/A converters has limited the use of such converters, especially for display panels with monolithic data drivers. A number of alternative converter arrangements have been proposed, the most popular of which is the sampled ramp converter as disclosed in U.S. Pat. No. 5,457,415 and as shown in FIG. 8. In this circuit the outputs of the storage register 32 for each data line 4 are supplied to a comparator 42 which controls the state of a switch 43 connecting a global ramp signal to the data line 4. The comparator 42 compares the contents of the storage register 32 with a global count signal supplied by way of a line 44 and maintains a connection between the ramp signal and the data line 4 only whilst the current global count is less than the contents of the storage register 42. Once the global count has exceeded the contents of the storage register 32, the ramp signal is disconnected from the data line 4 to leave the desired data voltage on the line capacitance. The main disadvantages of such a circuit are the large area required for its implementation and the need to supply an external ramp signal.

SUMMARY OF THE INVENTION

It is an object of the invention to provide a novel active matrix drive circuit which provides a number of advantages in use, particularly when used for monolithic drive circuits of TFTLCD's, such as polysilicon AMLCD's.

According to one aspect of the present invention, an active matrix digital drive circuit for sampling a digital input signal having n parallel bits and for supplying analogue drive signals to a plurality of lines, the drive circuit includes a control shift register including a chain of control shift elements having respective outputs; and a driver stage associated with each of the control shift elements. Each respective driver stage is arranged so as to sample the input signal for a corresponding one of the lines and to supply a drive signal to the line under the control of the respective control shift element. Each of the driver stages incorporates a sample shift register including a chain of n sample shift elements having n inputs and controlled by the control shift register such that, in a sampling mode, the n bits of the input signal are supplied in parallel to the n inputs of the sample shift elements, and, in a shifting mode, the n bits stored by the sample shift elements are shifted along the sample shift register towards at least one output of the sample shift register, and a serial digital-to-analogue converter coupled to said output of the sample shift register for sequentially receiving the bits shifted along the sample shift register and for supplying the analogue drive signal to the corresponding line in dependence thereon.

In one example, the control shift register controls sampling of the input and supply of drive signals to the lines such that the input signal is sampled for a first group of lines in a first subperiod and corresponding drive signals are supplied to the first group of lines in a second subperiod, and such that the input signal is sampled for a second group of lines in a subperiod which is at least partly coextensive with the second subperiod and corresponding drive signals are supplied to the second group of lines in a further subperiod.

In one example, the drive circuit is arranged so as to supply drive signals in successive line periods to rows of control elements in an active matrix in which the control elements are disposed at the intersections of the lines and the rows. The control shift register controls sampling of the input signal and supply of drive signals to the lines such that the input signal is sampled for a first group of control elements along a row in a first subperiod of one of the line periods and corresponding drive signals are supplied to the first group of control elements in a second subperiod of said one line period, and such that the input signal is sampled for a second group of control elements along the row in the second subperiod of said one line period and corresponding drive signals are supplied to the second group of control elements in a first subperiod of a further one of the line periods following said one line period.

In one example, each of the drive stages includes a multiplexing element arranged so as to supply a corresponding bit of the input signal to the input of each sample shift element in the sampling mode and to couple together the inputs and the outputs of the sample shift elements in the shifting mode to permit shifting of the stored bits along the sample shift register.

In one example, the multiplexing element includes a respective multiplexer associated with each sample shift element for receiving a corresponding bit of the input signal, and successive sample shift elements of the sample shift register are coupled together by the associated multiplexers to provide for shifting of all the stored bits along the sample shift register in a simple sequence towards the digital-to-analogue converter.

In one example, the multiplexing element includes a respective multiplexer associated with each sample shift element for receiving a corresponding bit of the input signal, a first group of the sample shift elements is coupled together by the associated multiplexers to provide for shifting of the even stored bits along the sample shift register towards a first output of the sample shift register, and a second group of the sample shift elements is coupled together by the associated multiplexers to provide for shifting of the odd stored bits along the sample shift register towards a second output of the sample shift register.

In one example, the drive circuit further includes a first clock element arranged so as to supply first clock signals to the control shift register to effect sampling of the input signal by clocking of the control shift elements at a first rate, and a second clock element arranged so as to supply second clock signals to the sample shift register to effect shifting of the stored bits by clocking of the sample shift elements at a second rate which is less than the first rate.

In one example, the sample shift elements are adapted to invert the bits applied to their inputs, and an inverter is provided at said output of the sample shift register for inverting the bits outputted by the sample shift register prior to their application to the digital-to-analogue converter.

In one example, the digital-to-analogue converter includes a capacitance element arranged so as to store a cumulative voltage due to the serial application of the bits of the sampled input signal outputted by the sample shift register to the capacitance element in a conversion mode, and a switch element arranged so as to transfer the stored voltage to the output of the digital-to-analogue converter in a drive mode after receipt of all the bits of the sampled input signal.

In one example, the digital-to-analogue converter comprises a respective buffer arranged so as to output the drive signal to each line.

In one example, the buffer incorporates an input capacitor for storing the voltage due to the serial application of the bits of the sampled input signal outputted by the sample shift register.

In one example, the buffer includes an amplifier and a compensating capacitance connected across the amplifier and arranged to store an initial offset voltage of the amplifier in a conversion mode and to apply the stored offset voltage as negative feedback in a drive mode.

In one example, the amplifier is an inverting amplifier.

In one example, the amplifier is a differential amplifier.

According to another aspect of the present invention, an active matrix liquid crystal display incorporating the drive circuit.

In one example, the drive circuit is implemented using thin-film transistors integrated on a display substrate.

In one example, the transistors are polysilicon thin film transistors.

According to the present invention there is provided an active matrix digital drive circuit for sampling a digital input signal having n parallel bits and for supplying analogue drive signals to a plurality of lines, the drive circuit comprising control shift register means comprising a chain of control shift elements having respective outputs, and a respective driver stage under the control of each control shift element for sampling the input signal for a corresponding one of the lines and supplying a drive signal to the line, wherein each of the driver stages incorporates sample shift register means comprising a chain of n sample shift elements having n inputs and controlled by the control shift register means such that, in a sampling mode, the n bits of the input signal are supplied in parallel to the n inputs of the sample shift elements, and, in a shifting mode, the n bits stored by the sample shift elements are shifted along the sample shift register means towards at least one output of the sample shift register means, and serial digital-to-analogue conversion means coupled to said output of the sample shift register means for sequentially receiving the bits shifted along the sample shift register means and for supplying an analogue drive signal to the corresponding line in dependence thereon.

Such a circuit provides a number of significant advantages as compared with prior arrangements such as those described above with reference to FIGS. 5 to 8 in which separate input and storage registers are required to sample the input digital signal and transfer the sampled signal to a D/A converter. Because only a single sample shift register and associated serial D/A converter is required for each data line, rather than separate input and storage registers and parallel D/A converters for converting the parallel data output of the storage register, such a circuit can be implemented in an extremely area efficient manner. This renders the circuit particularly suitable for monolithic fabrication on the substrate of a display, using polysilicon TFT circuitry. Furthermore the sample shift elements of such a circuit do not have to retain data for any significant length of time, and this means that the sample shift register can be implemented using dynamic logic which is inherently more compact than the static logic required for a conventional line memory. The decrease in circuit complexity due to the removal of the conventional storage register and the use of dynamic logic reduces the transistor count of the circuit and thus results in a higher yield.

The use of serial D/A conversion not only increases the area efficiency of the circuit but also allows the conversion accuracy to be increased. Since a serial D/A converter is inherently monotonic due to the same elements being used for each bit, it is possible, when the converter is implemented using switched capacitors, for larger capacitors to be used to improve matching and minimise charge injection.

Furthermore the conversion accuracy can be increased simply by increasing the number of storage elements in the converter.

Despite the serial nature of the D/A conversion, high speed buffered driving of the data lines is possible since the capacitors in the converter can be made relatively small and there is no requirement for a very large feedback capacitor, unlike in the parallel switched capacitor buffered converter described above with reference to FIG. 7. This is particularly important in the case of the monolithic fabrication of the circuit referred to above where low mobility polycrystalline thin film transistors are used and the performance of the amplifier is generally the limiting factor. The speed of conversion can be improved even further if the conversion is performed in a pseudo serial manner as described below with reference to FIG. 16.

In one embodiment of the invention the control shift register means controls sampling of the input signal and supply of drive signals to the lines such that the input signal is sampled for a first group of lines in a first subperiod and corresponding drive signals are supplied to the first group of lines in a second subperiod, and such that the input signal is sampled for a second group of lines in a subperiod which is at least partly coextensive with the second subperiod and corresponding drive signals are supplied to the second group of lines in a further subperiod.

The invention is particularly applicable to a drive circuit for supplying drive signals in successive line periods to rows of control elements in an active matrix in which the control elements are disposed at the intersections of the lines and the rows, wherein the control shift register means controls sampling of the input signal and supply of drive signals to the lines such that the input signal is sampled for a first group of control elements along a row in a first subperiod of one of the line periods and corresponding drive signals are supplied to the first group of control elements in a second subperiod of said one line period, and such that the input signal is sampled for a second group of control elements along the row in the second subperiod of said one line period and corresponding drive signals are supplied to the second group of control elements in a first subperiod of a further one of the line periods following said one line period.

Preferably each of the driver stages comprises multiplexing means for supplying a corresponding bit of the input signal to the input of each sample shift element in the sampling mode and for coupling together the inputs and the outputs of the sample shift elements in the shifting mode to permit shifting of the stored bits along the sample shift register means. The multiplexing means may comprise a respective multiplexer associated with each sample shift element for receiving a corresponding bit of the input signal, and successive sample shift elements of the sample shift register means are coupled together by the associated multiplexers to provide for shifting of all the stored bits along the sample shift register means in a simple sequence towards the digital-to-analogue conversion means.

Alternatively the multiplexing means may comprise a respective multiplexer associated with each sample shift element for receiving a corresponding bit of the input signal, a first group of the sample shift elements is coupled together by the associated multiplexers to provide for shifting of the even stored bits along the sample shift register means towards a first output of the sample shift register means, and a second group of the sample shift elements is coupled together by the associated multiplexers to provide for shifting of the odd stored bits along the sample shift register means towards a second output of the sample shift register means. This enables the speed of conversion to be improved by performing the conversion in a pseudo-serial manner.

Conveniently the drive circuit comprises first clock means for supplying first clock signals to the control shift register means to effect sampling of the input signal by clocking of the control shift elements at a first rate, and second clock means for supplying second clock signals to the sample shift register means to effect shifting of the stored bits by clocking of the sample shift elements at a second rate which is less than the first rate.

Furthermore the sample shift elements may be adapted to invert the bits applied to their inputs, and inverting means may be provided at said output of the sample shift register means for inverting the bits outputted by the sample shift register means prior to their application to the digital-to-analogue conversion means.

The digital-to-analogue conversion means may comprise capacitance means for storing a cumulative voltage due to the serial application of the bits of the sampled input signal outputted by the sample shift register means to the capacitance means in a conversion mode, and switch means for transferring the stored voltage to the output of the digital-to-analogue conversion means in a drive mode after receipt of all the bits of the sampled input signal.

Preferably the digital-to-analogue conversion means comprises a respective buffer for outputting the drive signal to each line. The buffer may incorporate an input capacitor for storaging the voltage due to the serial application of the bits of the sampled input signal outputted by the sample shift register means. Furthermore the buffer may comprise an amplifier and a compensating capacitance connected across the amplifier and arranged to store an initial offset voltage of the amplifier in a conversion mode and to apply the stored offset voltage as negative feedback in a drive mode.

Such a drive circuit is preferably used for driving an active matrix device as described in British Patent Application No. 9706942.1 (SLE 96056) utilizing a part-line-at-a-time driving scheme. In such a scheme the drive circuitry may independently control the lines in two or more parts of the active matrix so as to provide a pipeline delay of part of a line period during which serial conversion and line driving can occur.

These and other advantages of the present invention will become apparent to those skilled in the art upon reading and understanding the following detailed description with reference to the accompanying figures.

BRIEF DESCRIPTION OF THE DRAWINGS

In order that the invention may be more fully understood, reference will now be made, by way of example, to the accompanying drawings, in which.

DESCRIPTION OF THE PREFERRED EMBODIMENTS

Figure 1:
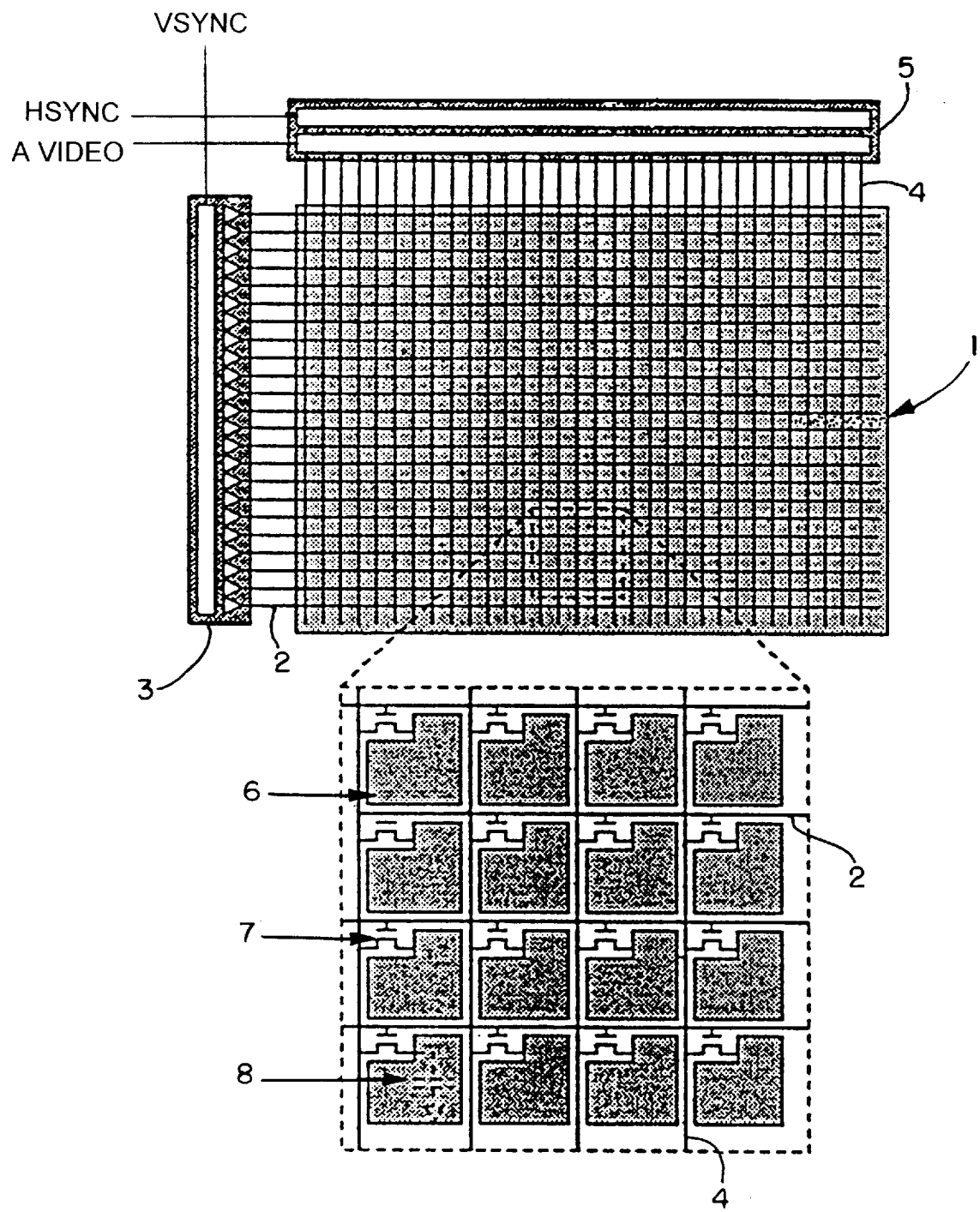
FIG. 1 diagrammatically shows a prior art AMLCD.
Figure 2:
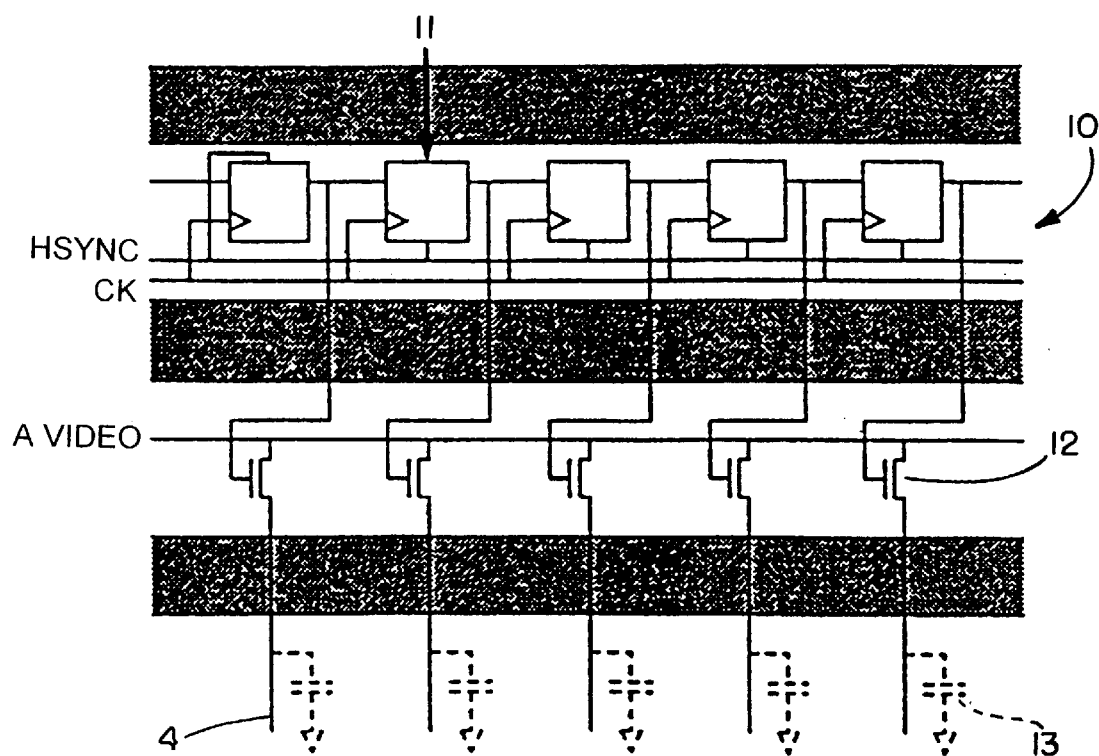
FIG. 2 shows a prior art analogue point-at-a-time data line driver circuit.
Figure 3A:
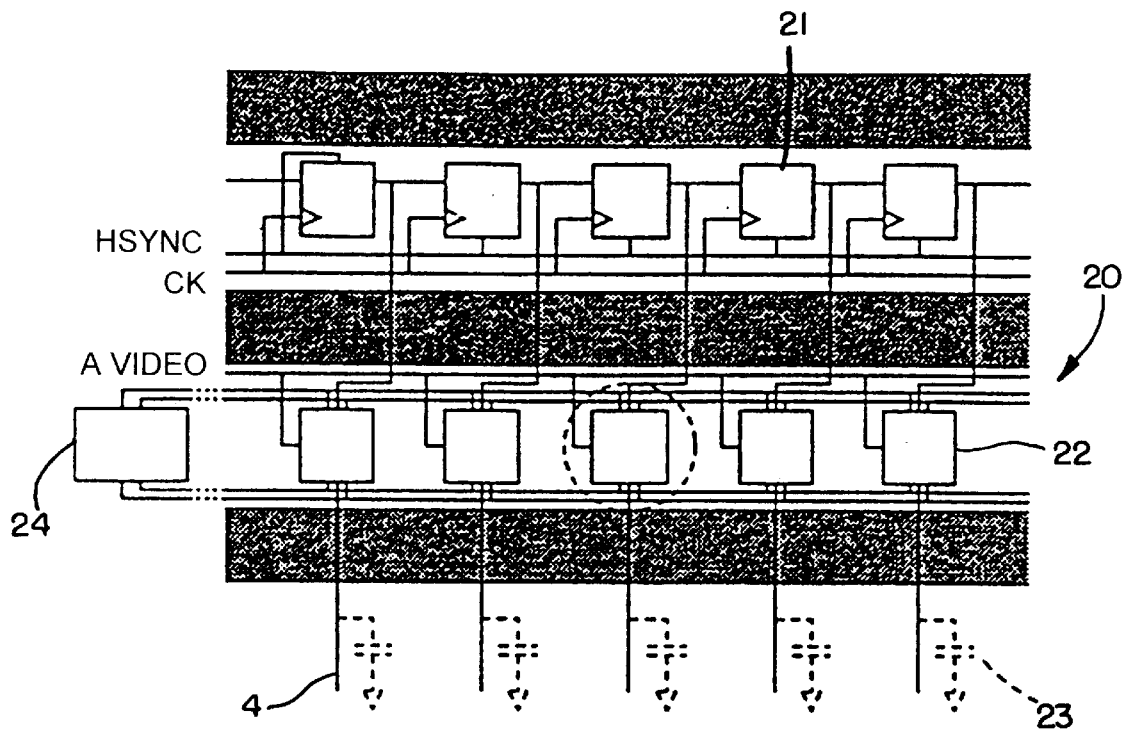
FIGS 3a and 3b show a prior art analogue line-at-a-time data line driver circuit.
Figure 3B:
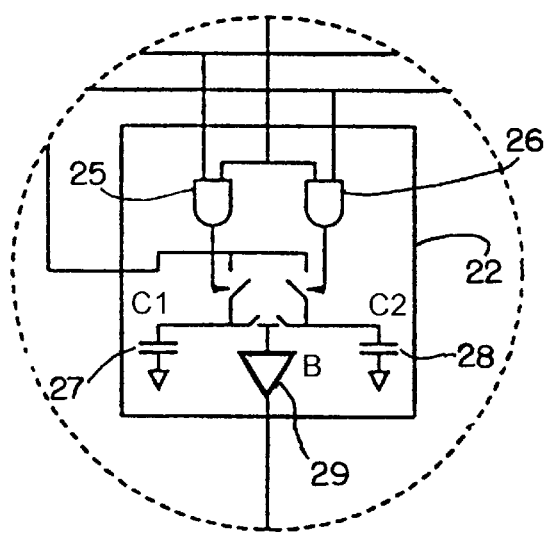
Figure 4A:
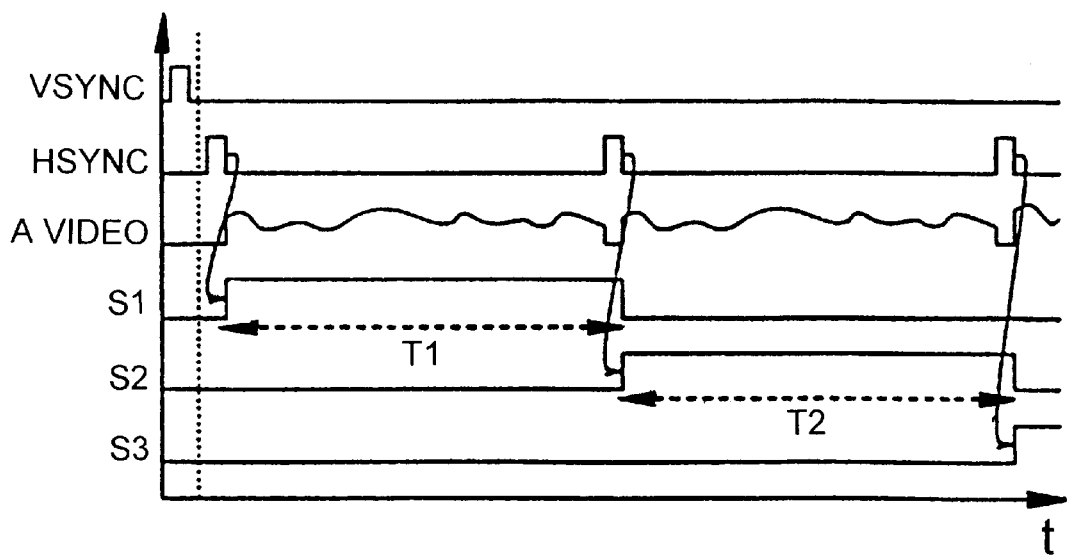
FIGS. 4a and 4b show timing diagrams for the circuits of FIGS. 2 and 3.
Figure 4B:
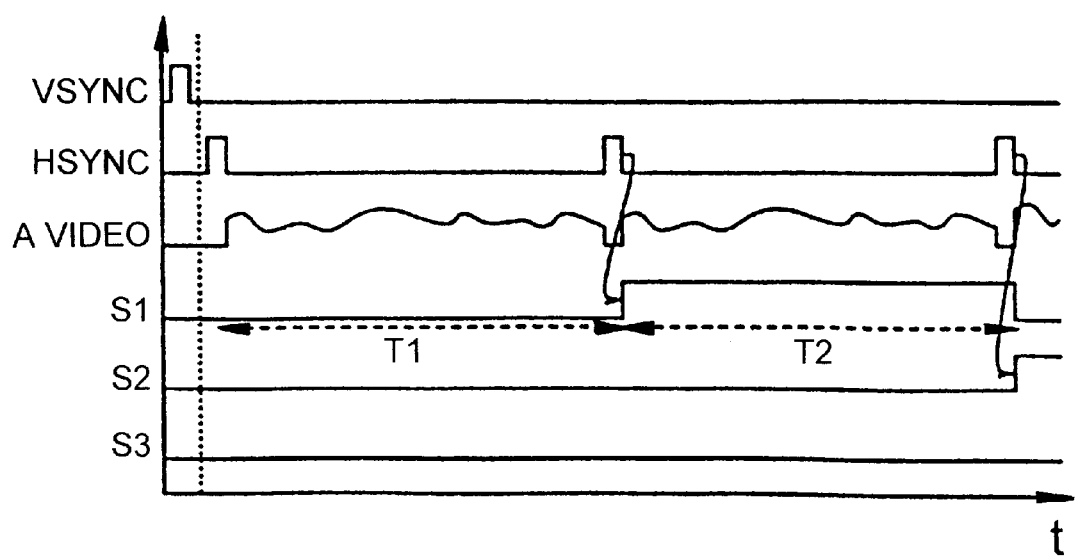
Figure 5:
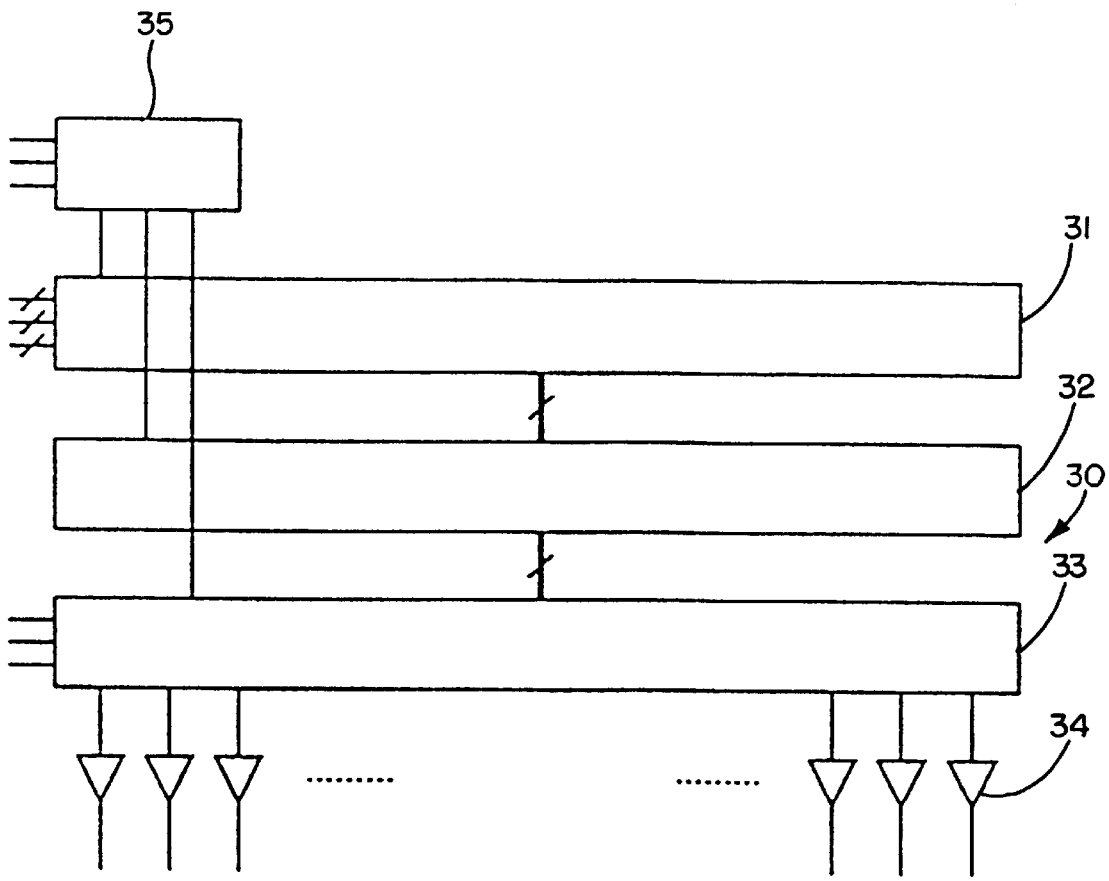
FIG. 5 shows a prior art digital line-at-a-time data line driver circuit.
Figure 6:
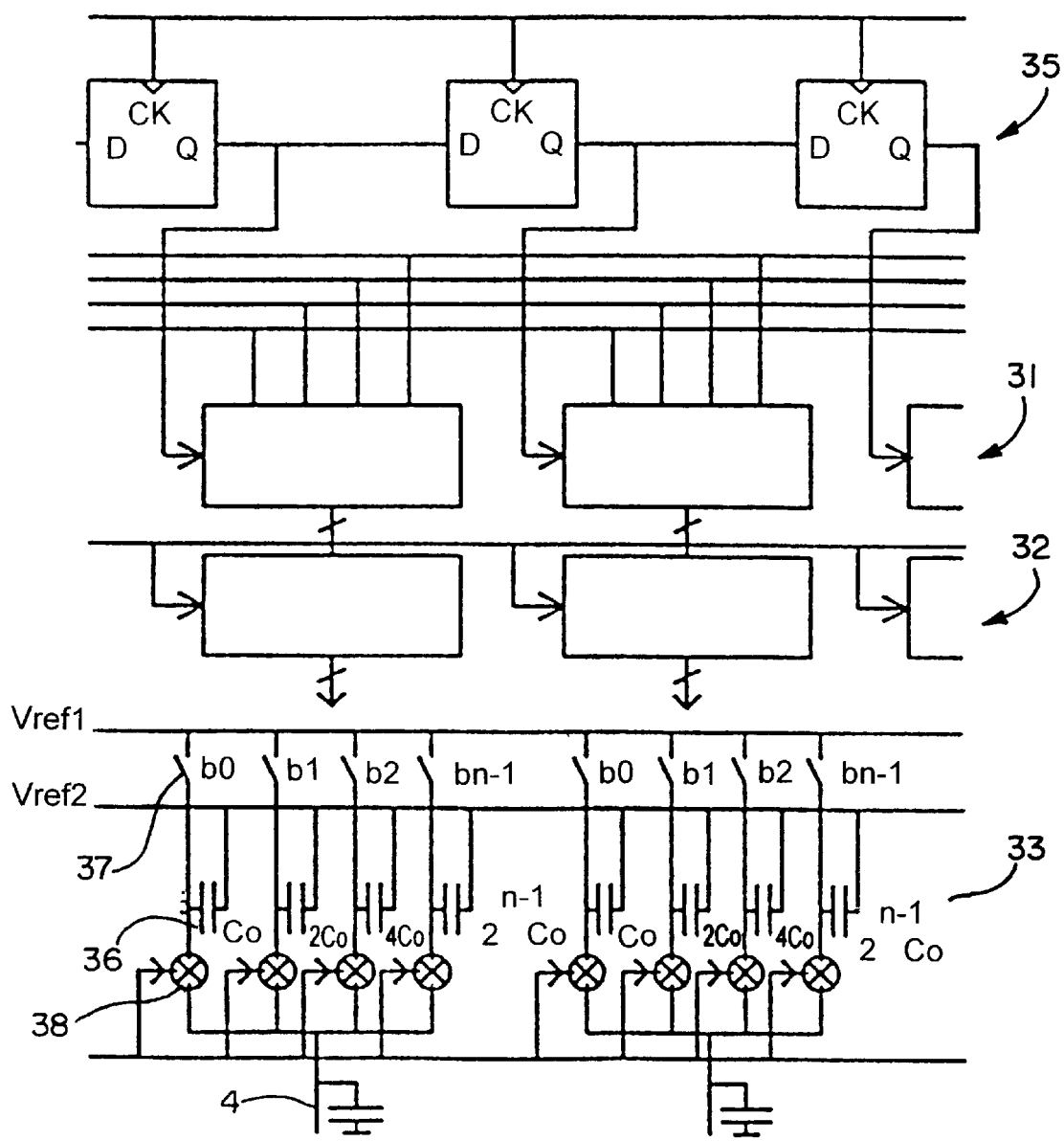
FIGS. 6, 7 and 8 show three different prior art D/A converters.
Figure 7:
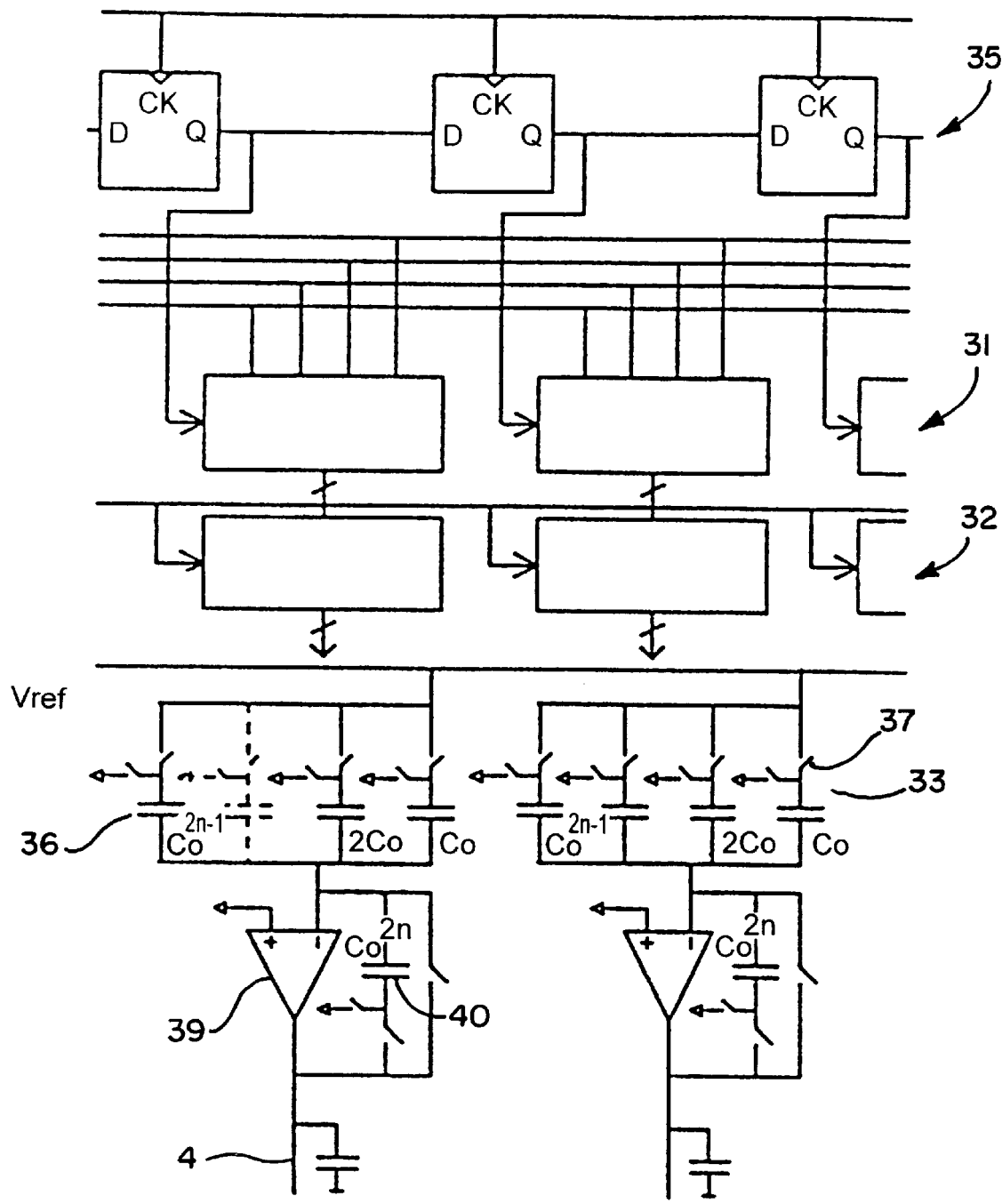
Figure 8:
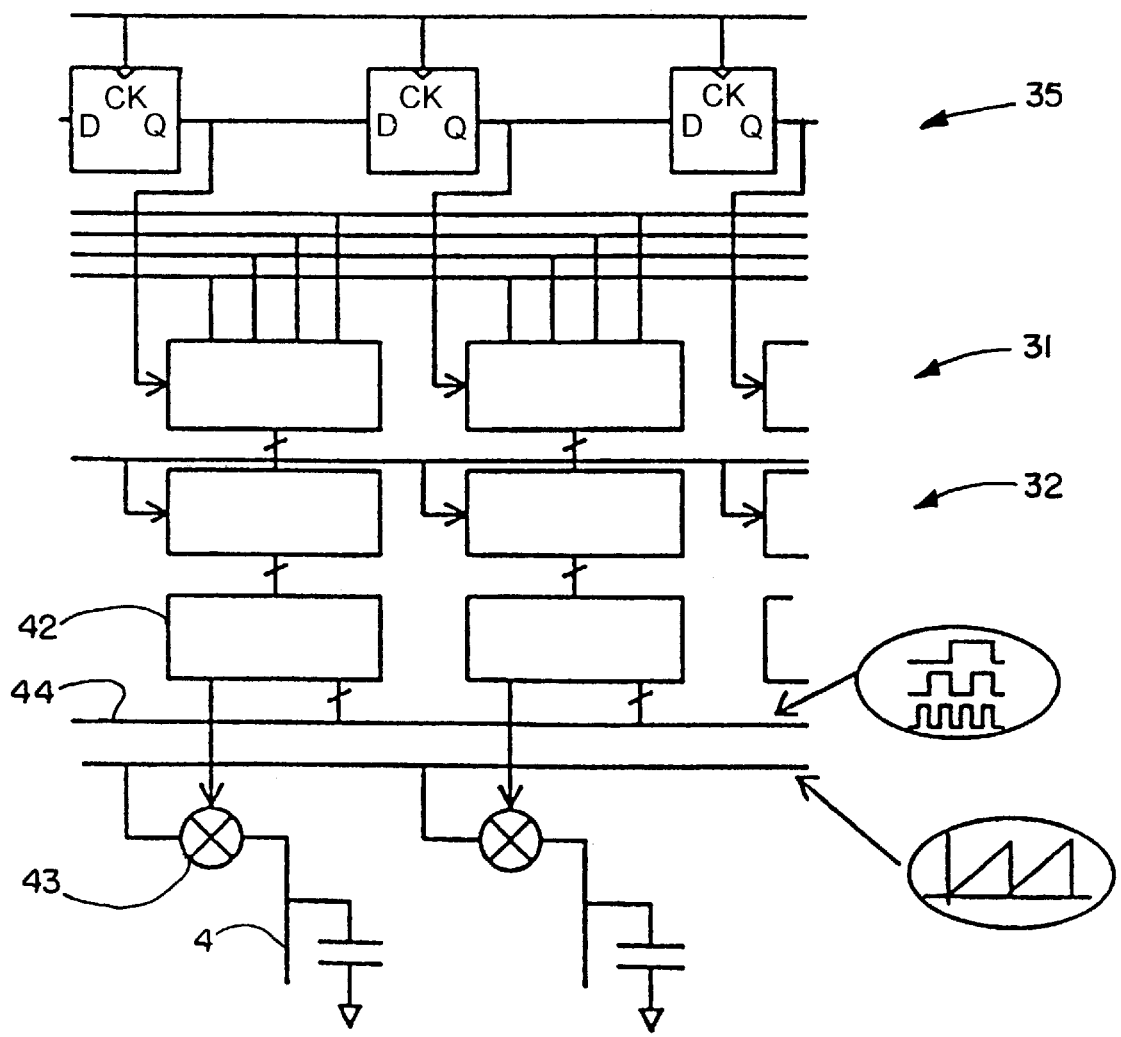
Figure 9:
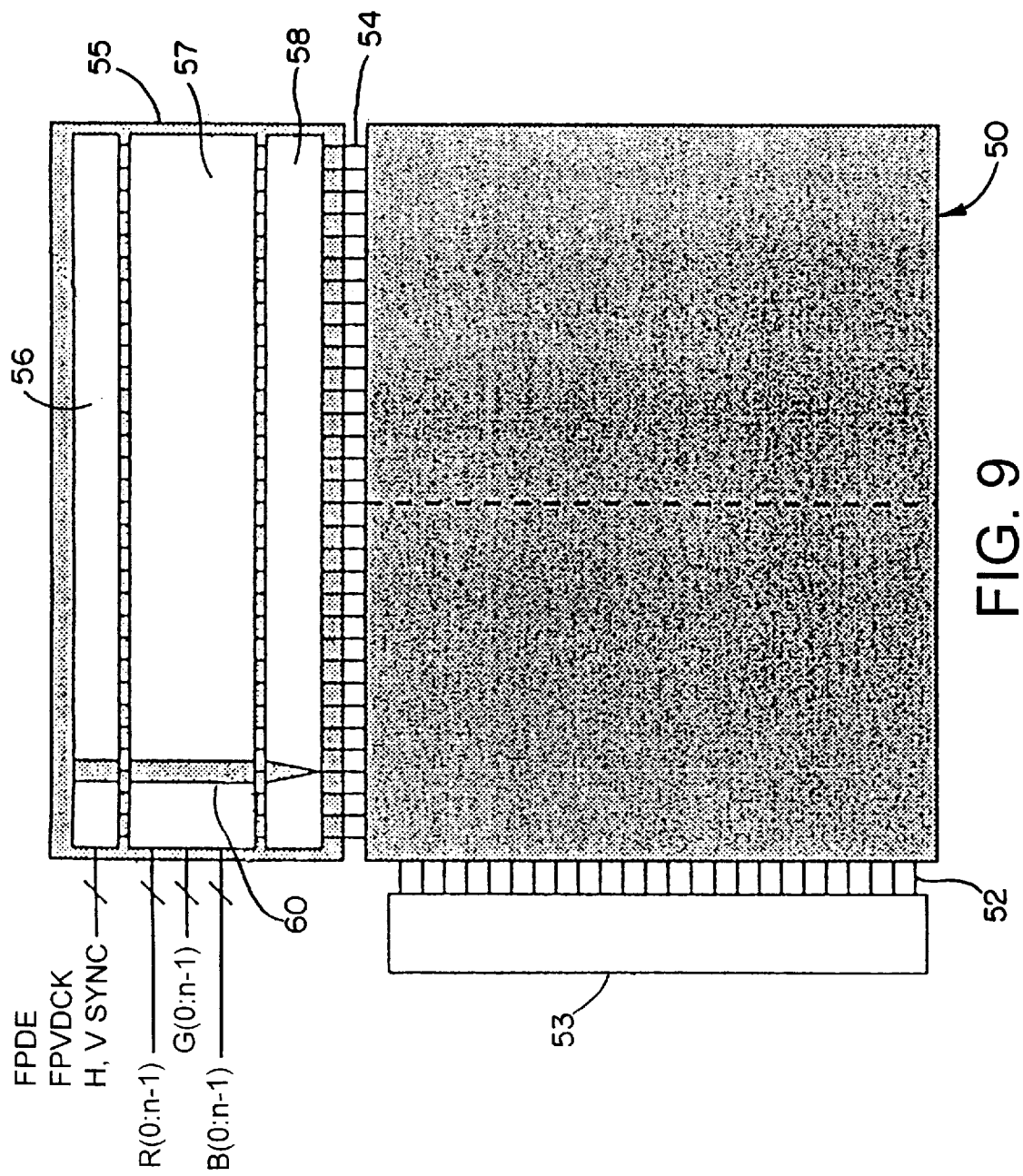
FIG. 9 diagrammatically shows an AMLCD utilising a half-line-at-a-time driving scheme and incorporation a data line driver circuit in accordance with the invention.

Reference will first be made to the generalised diagram of FIG. 9 showing an AMLCD 50 utilising a half-line-at-a-time driving scheme and composed of N rows and M columns of pixels addressable by scan lines 52 connected to a scan line driver circuit 53 and data lines 54 connected to a data line driver circuit 55 in accordance with the invention. The data line driver circuit 55 comprises a distributed controller 56 in the form of a control shift register and associated logic circuitry, a digital data sample-shift array 57 and bit serial D/A converters 58. The main signals which are received by the controller 56 are the horizontal line synchronisation signal HSYNC, the vertical line synchronisation signal VSYNC, the flat panel video clock signal FDVDCK and the flat panel display enable signal FPDE. For a colour display the sample-shift array 57 receives the RGB input data signals, each signal comprising n parallel bits.

Figure 10:
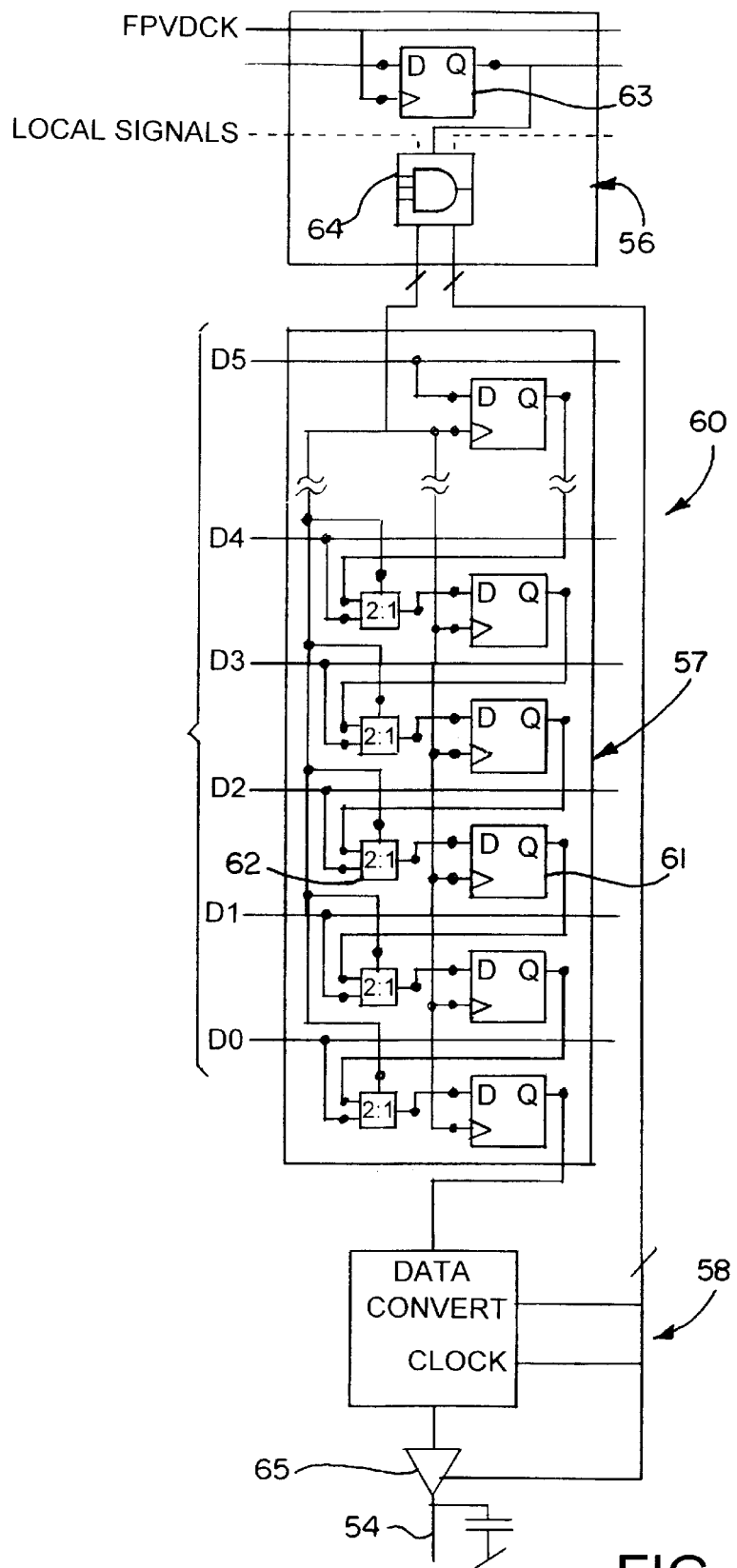
FIGS. 10 and 11 show a detail of one data driver stage of the data line driver circuit of FIG. 9 and corresponding timing diagram.

FIG. 10 shows one of the data driver stages 60 of the data line driver circuit 55 in greater detail. It will be seen from this figure that the sample-shift array 57 comprises an n-bit vertically connected sample shift register composed of D-type flip-lops (DFF's) 61 and associated 2:1 multiplexers 62 which are used to provide an input either from the relevant bit line of the n-bit digital input data bus or from the output of the preceding DFF. Sample and shift control signals for the sample-shift array 57 are generated locally by the associated DFF 63 of the control shift register and associated detection logic 64 of the controller 56, which also generate local control signals for the serial D/A converter 58 and output buffer 65. Because only a single sample shift register and associated serial D/A converter 58 is required for each data line 54, rather than separate input and storage registers and parallel D/A converters as in the prior art arrangements, such a circuit 55 can be implemented in an extremely area efficient manner. This renders the circuit particularly applicable for monolithic fabrication on the substrate of a display, using polysilicon TFT circuitry. Furthermore the DFF's 61 do not have to retain data for any significant length of time, and this means that the sample shift register can be implemented using dynamic logic which is inherently more compact than the static logic required for a conventional line memory. The decrease in circuit complexity due to removal of the conventional storage register and the use of dynamic logic reduces the transistor count of the circuit and thus results in a higher yield. The use of serial D/A conversion not only increases the area efficiency of the circuit 55 but also allows the conversion accuracy to be increased.

Figure 11:
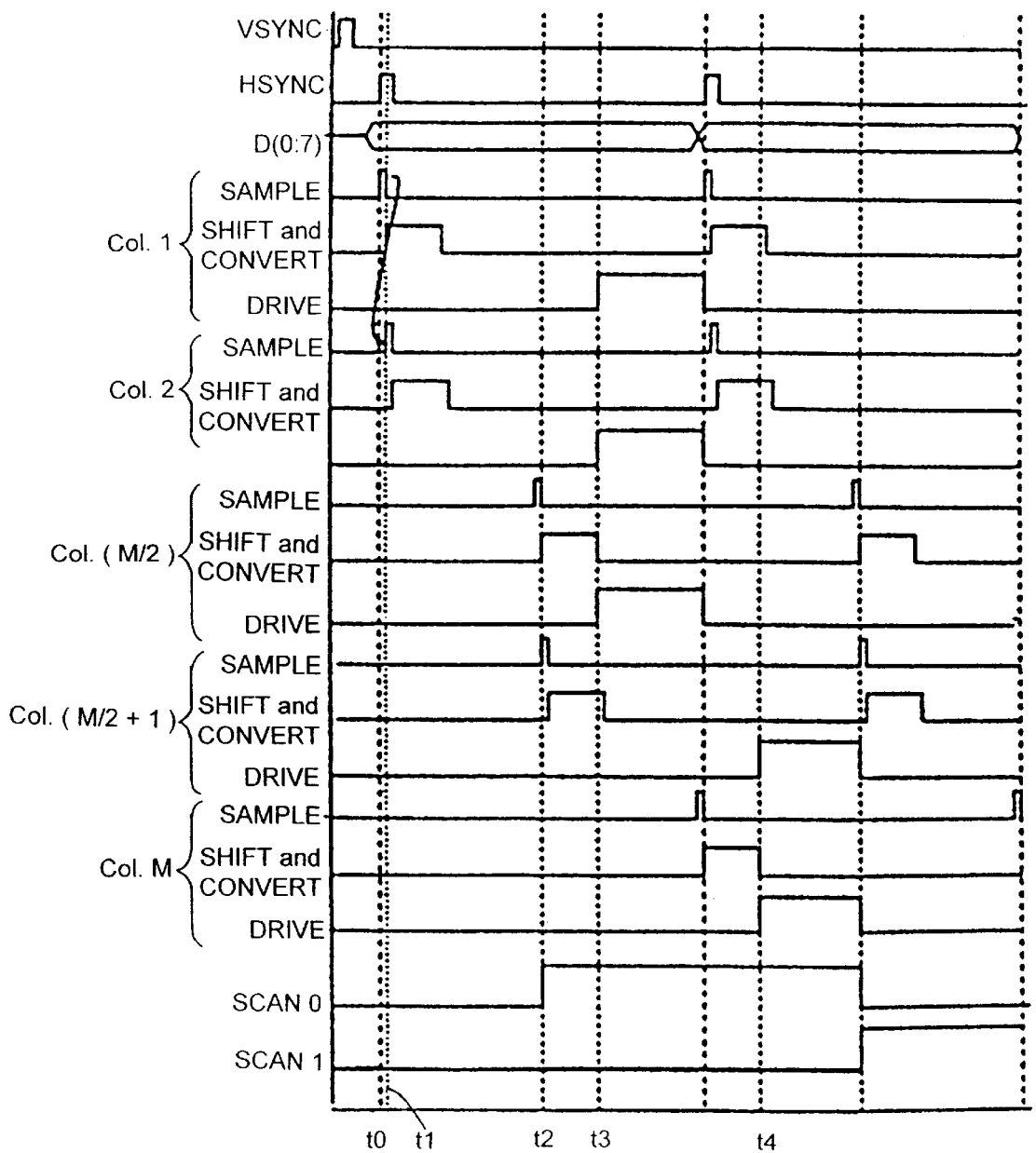

The operation of the data line driver circuit 55 will now be described with reference to the timing diagram of FIG. 11. At the beginning of the transmission of an image frame, the VSYNC signal indicates the beginning of a new frame, and shortly afterwards the HSYNC signal indicates the first line of data is about to arrive. The parallel input data bus D may comprise up to 8 bits per colour. At time t0, the parallel data bits for the first data line of the display arrive on the input data bus D, and the controller 56 generates a SAMPLE signal which causes the shift register of the first data driver stage 60 to preload and latch (sample) the data. At time t1 (one pixel period later), the controller 56 generates a SAMPLE signal for the shift register of the second data driver stage 60, causing the data to be sampled for the next data line. Meanwhile the controller 56 generates a SHIFT signal which causes the data latched into the first data driver stage 60 to be shifted down the shift register by one bit so that the least significant bit of the data enters the serial D/A converter 58. This process of sampling and shifting is repeated for each data driver stage 60 of the data line driver circuit 55. FIG. 11 shows the SAMPLE and SHIFT signals, as well as the corresponding drive signal, for each of columns 1, 2, M/2, M/2+1 and M of a display driven by such a data line driver circuit 55 utilising a half-line-at-a-time driving scheme, and also scan voltages SCAN 0 and SCAN 1 applied to successive scan lines by the scan line driver circuit 53.

British Patent Application No. (SLE 966056) discloses a half-line-at-a-time driving scheme in which the data driver stages are coupled to the data lines by a bank of switches. In operation of such a scheme, once the data driver stages of left half of the data line driver circuit have sequentially sampled and converted the data, namely at time t3, the outputs of these data driver stages are connected by the associated switched to the corresponding data lines so as to drive the data lines to the desired voltages. The sample and shift operations are repeated for the data driver stages of the right half of the data line driver circuit and, at time t4, the outputs of these data driver stages are connected to the corresponding data lines by the associated switches so as to drive the data lines to the desired voltages. Such interleaved operation of the right and left halves of the data line driver circuit is shown in FIG. 11, and is repeated for each row in the display. A somewhat similar data line driver circuit may be used for the alternative half-line-at-a-time driving scheme described in the above British patent application utilizing split scan lines, although such a circuit will not be described in detail in this specification.

Possible forms of the distributed controller 56 are described in British Patent Application No. 9706941.3 (SLE 96057) so that these will not be described in detail in this specification. However, in the embodiment described with reference to FIGS. 9 to 11, it is preferred that the controller 56 is in the form of a shift register comprising a chain of DFF's in which some of the DFF's towards the end of the shift register are programmed so as to be set to an initial state, such as 1100100010001000110001 (reading from right to left), on resetting of the shift register so as to define a signal control pattern. Furthermore the output of the last DFF is connected to the input of the first DFF of the shift register of the controller 56. As the shift register is clocked, the signal control pattern is shifted along the register and, when the signal control pattern reaches the relevant DFF within the register, the pattern is detected by the detection logic 64 and is caused to generate control signals for controlling operation of the corresponding sample-shift array 57, D/A converter 58 and output buffer 65. Such an arrangement allows control signals to be generated which are of relatively low frequency with respect to the clock frequency.

Figure 12:
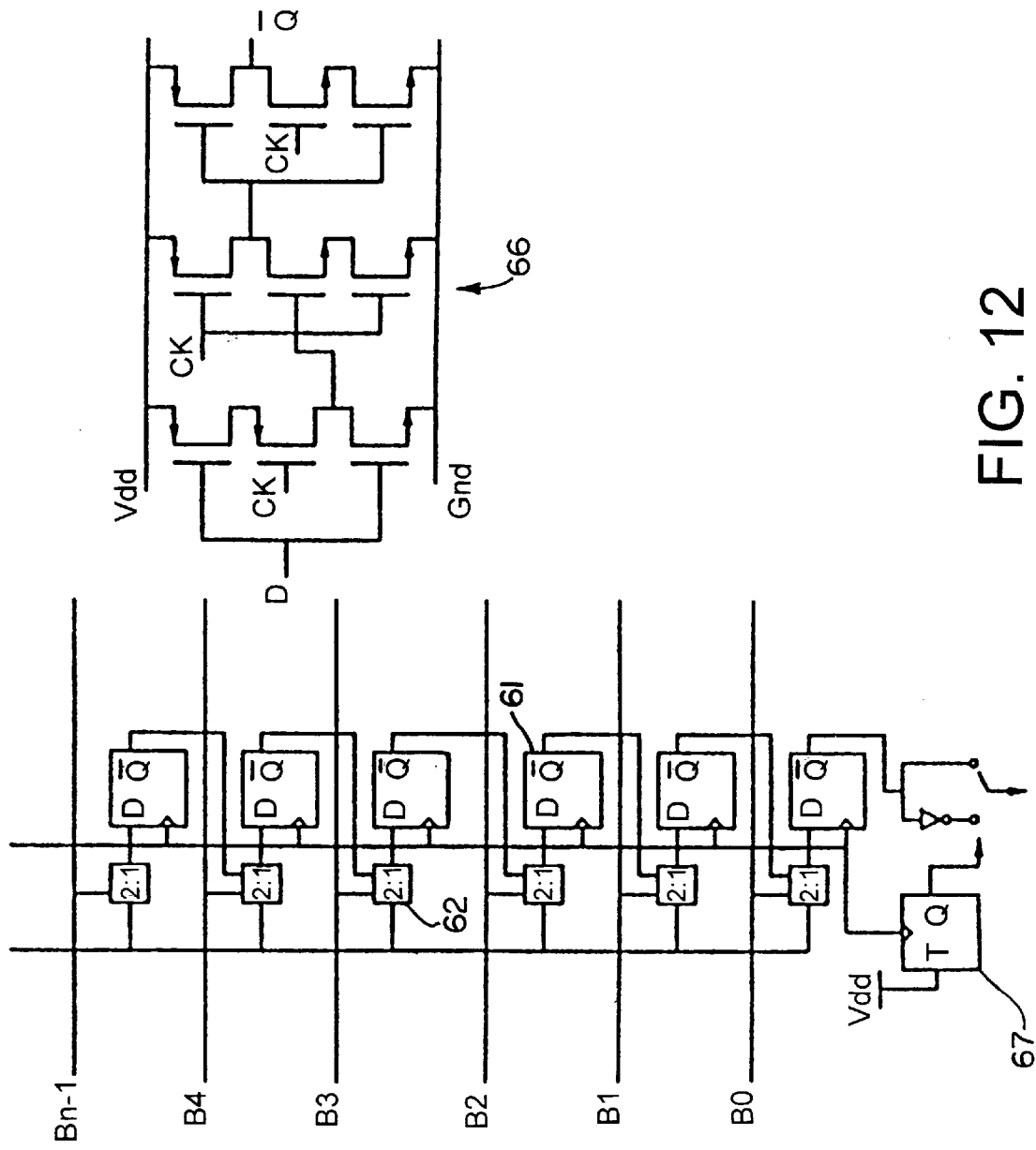
FIG. 12 shows a sample-shift array which may be used in the data line driver circuit of FIG. 9 for increase are efficiency.

The DFF's 61 of the sample-shift array 57 can be implemented in static logic, although the use of dynamic techniques, such as true single phase clocking (TSPC), enables circuit area to be minimised and speed to be maximised. A further improvement in circuit area efficiency can be achieved if inverting DFF's 61' are used as shown in FIG. 12. The circuit diagram 66 of such an inverting DFF 61', which is also shown in FIG. 12, demonstrates that such a flip-flop can be implemented with as few as nine transistors. The inversion introduced by each DFF 61' is corrected by means of a toggle call 67 when the data is clocked out of the shift register prior to entering the bit serial D/A converter.

There are a number of forms of serial D/A converter which may be used in such a data line driver circuit 55, such as converters based on algorithmic or charge sharing, for example as disclosed by P. Allen and D. Holberg, "*CMOS Analog Circuit Design*", Harcourt Brace Jovanovich College Publishers, 1987. For displays of large size or high pixel resolution, it is necessary to employ a buffer to drive the moderately high capacitative loads. However one of the problems encountered in use of such buffers is the inherent offset voltage. This is a particular problem for display panels having monolithic data drivers constructed using polysilicon. In such a case it is necessary for the converter to incorporate some form of offset compensation. In order to avoid DC voltages across the liquid crystal material at each pixel, the data voltage can be periodically inverted, in which case the controller 56 is used to determine whether the reference voltage for a particularly converters is set positive or negative. A variety of inverting drive schemes may be used, including per-pixel per-frame inversion in which each pixel has an opposite polarity to the neighboring pixels and each pixel changes its polarity in alternate frames.

Figure 13:
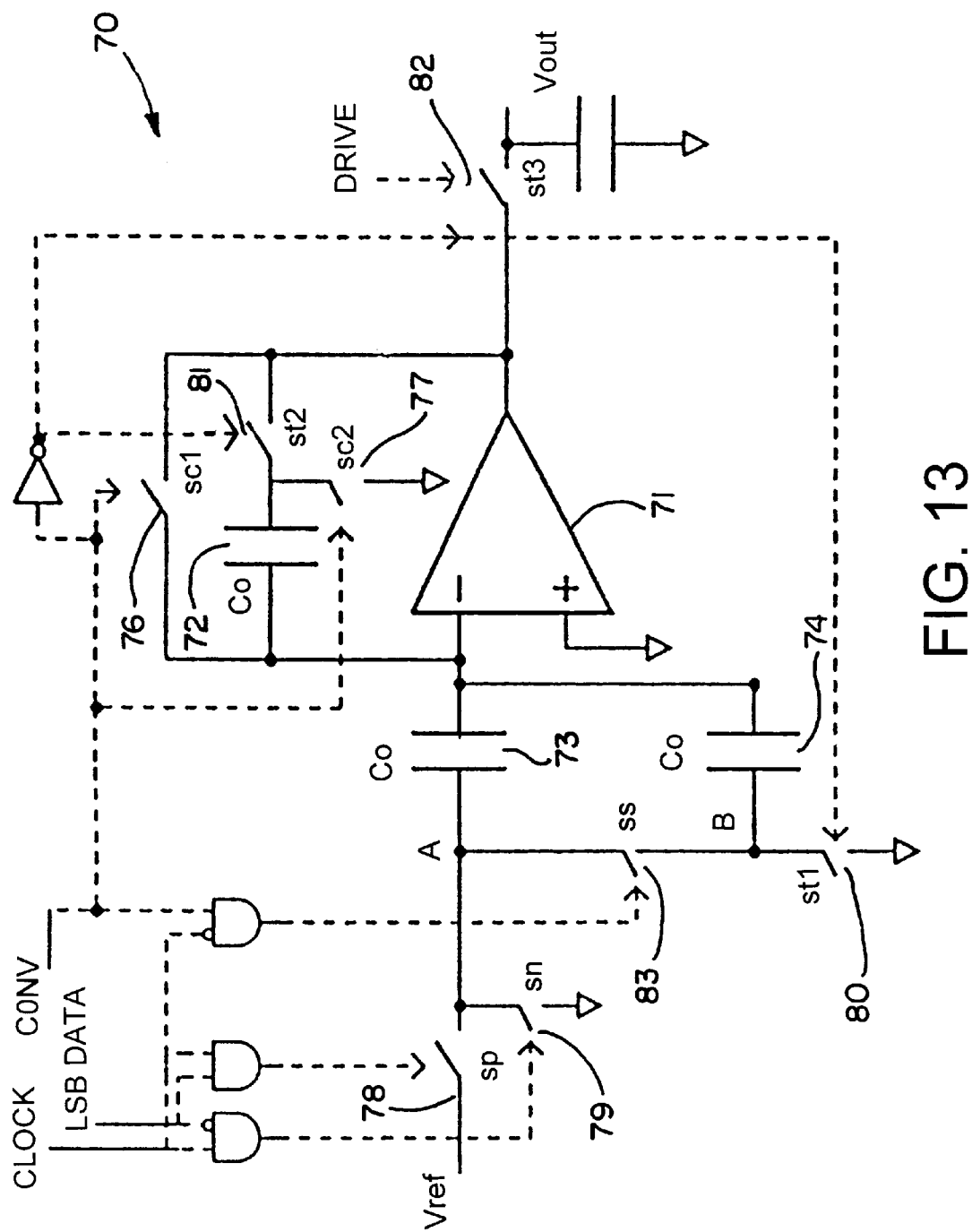
FIGS. 13 and 14 show two alternative serial D/A converters which may be used in the data line driver circuit of FIG. 9.

FIG. 13 shows a charge sharing serial D/A converter 70 using an offset removal scheme, as disclosed by U.S. Pat. No. 4,439,693, and which comprises an inverting amplifier 71 and associated capacitors 72, 73, and 74 and switches 76, 77, 78, 79, 80, 81, 82 and 83. Such a converter possesses the advantage that it uses only a single ended inverting amplifier, and additionally the constant virtual potential at the inverting terminal offers a degree of robustness to stray capacitance. However the disadvantage of such a converter is that, since the amplifier must maintain a virtual potential during the conversion process, the settling times of the amplifier will limit the speed of conversion. Since a serial D/A converter is inherently monotonic due to the same elements being used for each bit, it is possible, when using switched capacitors in such a converter, for larger capacitors to be used to improve matching and minimise charge injection. Furthermore the conversion accuracy can be increased simply by increasing the number of storage elements in the converter. Despite the serial nature of the D/A conversion, high speed buffered driving of the data lines is possible since the capacitors in the converter can be made relatively small and there is no requirement for a very large feedback capacitor. This is particularly important in the case of the monolithic fabrication of the circuit referred to above where low mobility polycrystalline thin film transistors are used and the performance of the amplifier is generally the limiting factor.

Figure 15A:
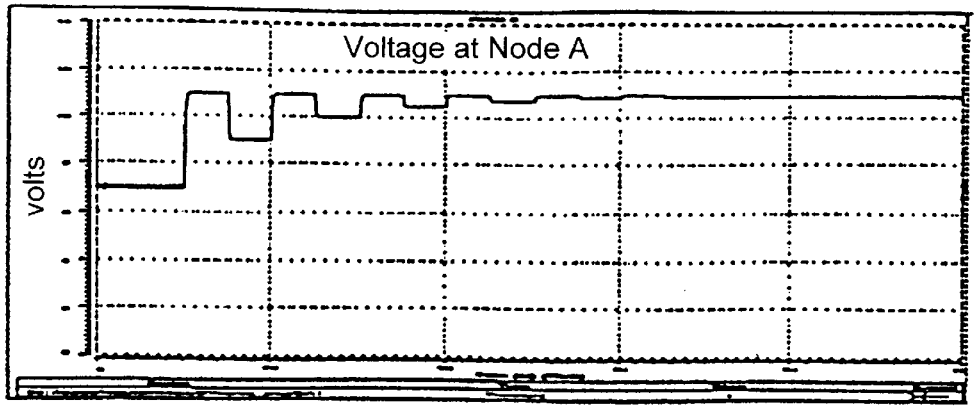
FIGS. 15*a*, 15*b* and 15*c* show a timing diagram of the D/A converter of FIG. 13.
Figure 15B:
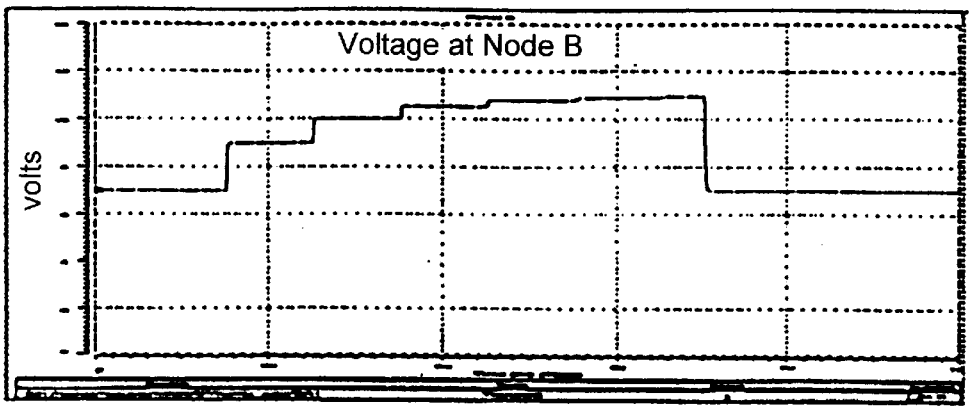
Figure 15C:
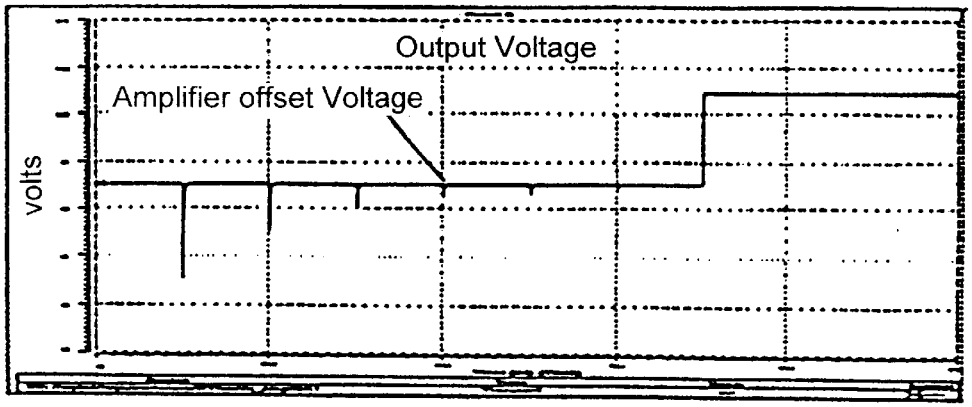

The operation of the converter 70 is as follows. The inverting amplifier 71 is first placed in the voltage follower mode by setting of a control signal CONV to "1" which operates to effect closing of the switches 76 and 77 so that the offset voltage of the amplifier 71 is stored across the feedback capacitor 72. During a clock HIGH period each bit of data received by the converter 70 closes on of the switches 78 or 79, depending on whether the bit is a "1" or a "0", causing the node A to charge up to either Vref or analogue ground. During a clock LOW period, the switch 83 is closed so that the charge at node A is shared with node B. This process is repeated for each bit to be converted. At the end of the conversion process, the control signal CONV is set to "0", thus opening the switches 76 and 77 and closing the switches 80 and 81. The voltage at node B is thus transferred to the output of the amplifier 71, and the offset voltage stored by the capacitor 72 in the negative feedback loop is simultaneously subtracted. The switch 82 is used to isolate the output of the converter until such time as it is required to drive the corresponding data line and is one of the switches of the bank of switches used in the half-line-at-a-time driving scheme referred to above. A corresponding timing diagram for conversion of the data signal DATA= 111111 is shown in FIG. 15a (voltage at node A), FIG. 15b (voltage at node B) and FIG. 15c (output voltage) for a reference voltage of 11 V and an analogue ground voltage of 7 V at the non-inverting terminal.

Figure 14:
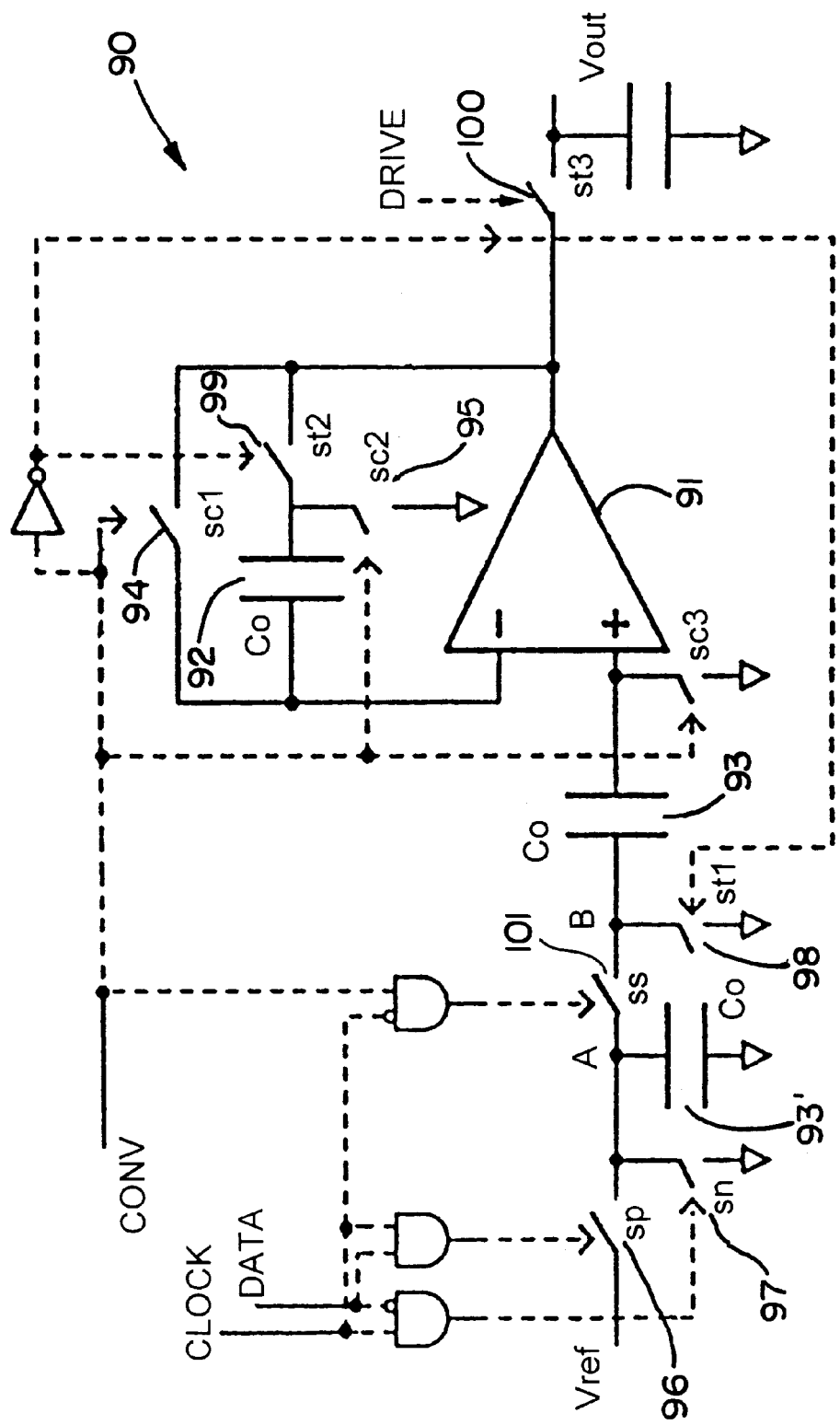

FIG. 14 shows a serial D/A converter 90 which uses an amplifier 91 in the voltage follower mode and employs an offset removal scheme, as disclosed by U.S. Pat. No. 4,306, 196. Such a converter is inherently faster than the converter of FIG. 13 since the voltage follower plays no role in the conversion process, although it does require a differential amplifier. In this case capacitors 92, 93 and 93' and switches 94, 95, 96, 97, 98, 99, 100 and 101 perform similar functions to the corresponding components in the converter of FIG. 13. The operation of the converter of FIG. 14 is essentially similar to the operation of the converter of FIG. 13 except that the output is inverted with respect to analogue ground.

Figure 16:
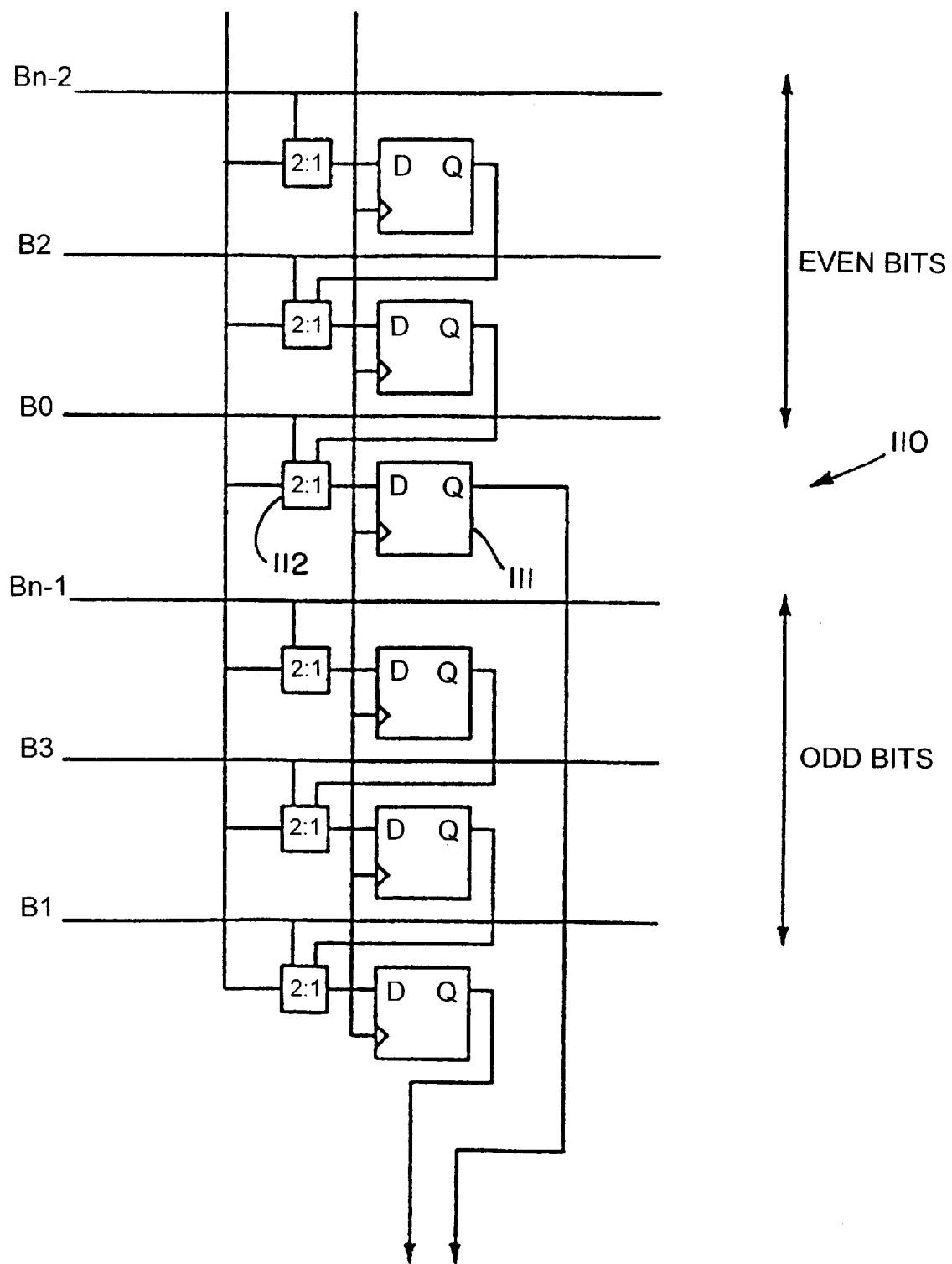
FIG. 16 shows an alternative sample-shift array for the data line driver circuit of FIG. 9.
Figure 17:
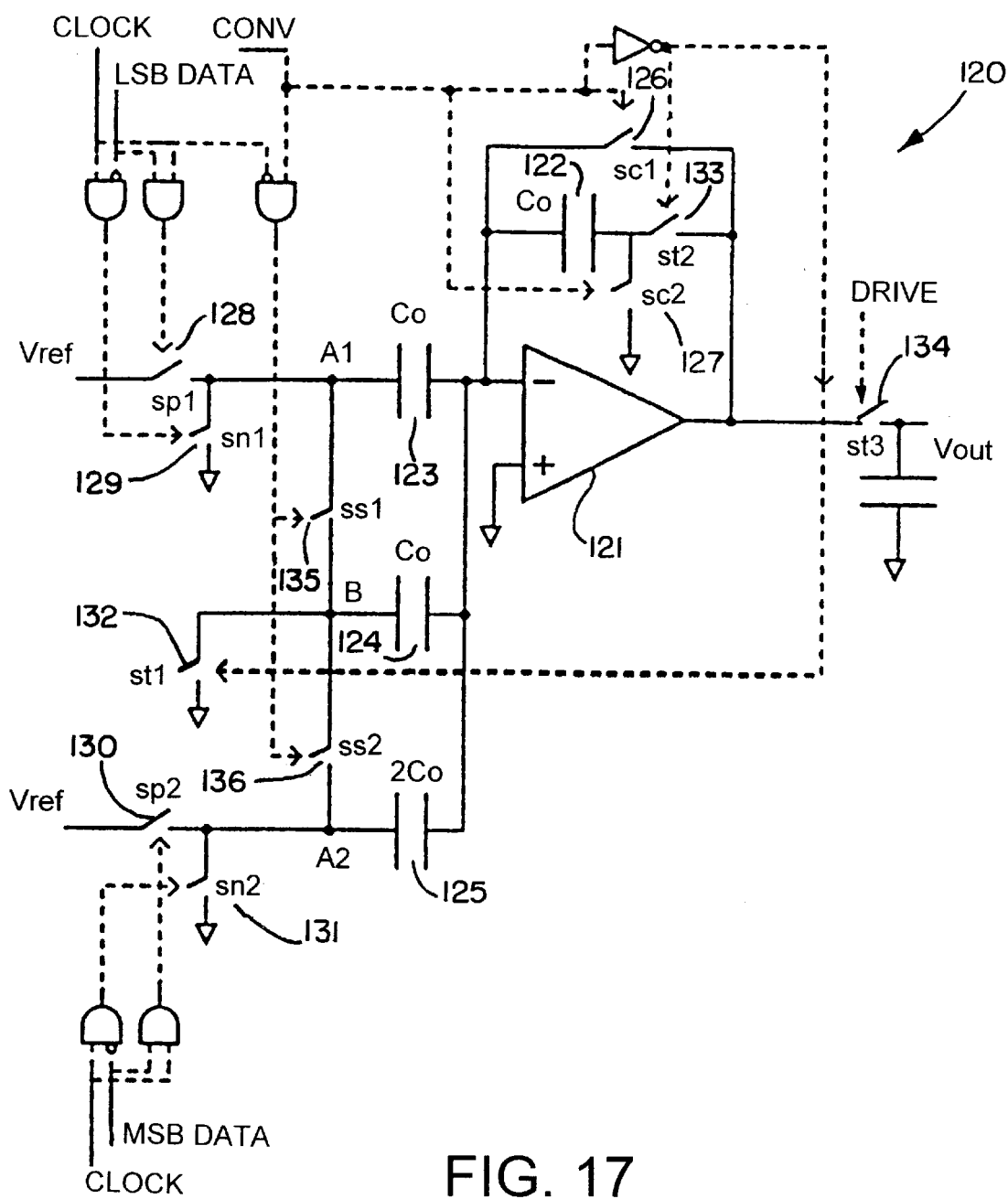
FIGS. 17 and 18 show two alternative serial D/A converters for use with the sample-shift array of FIG. 16.
Figure 18:
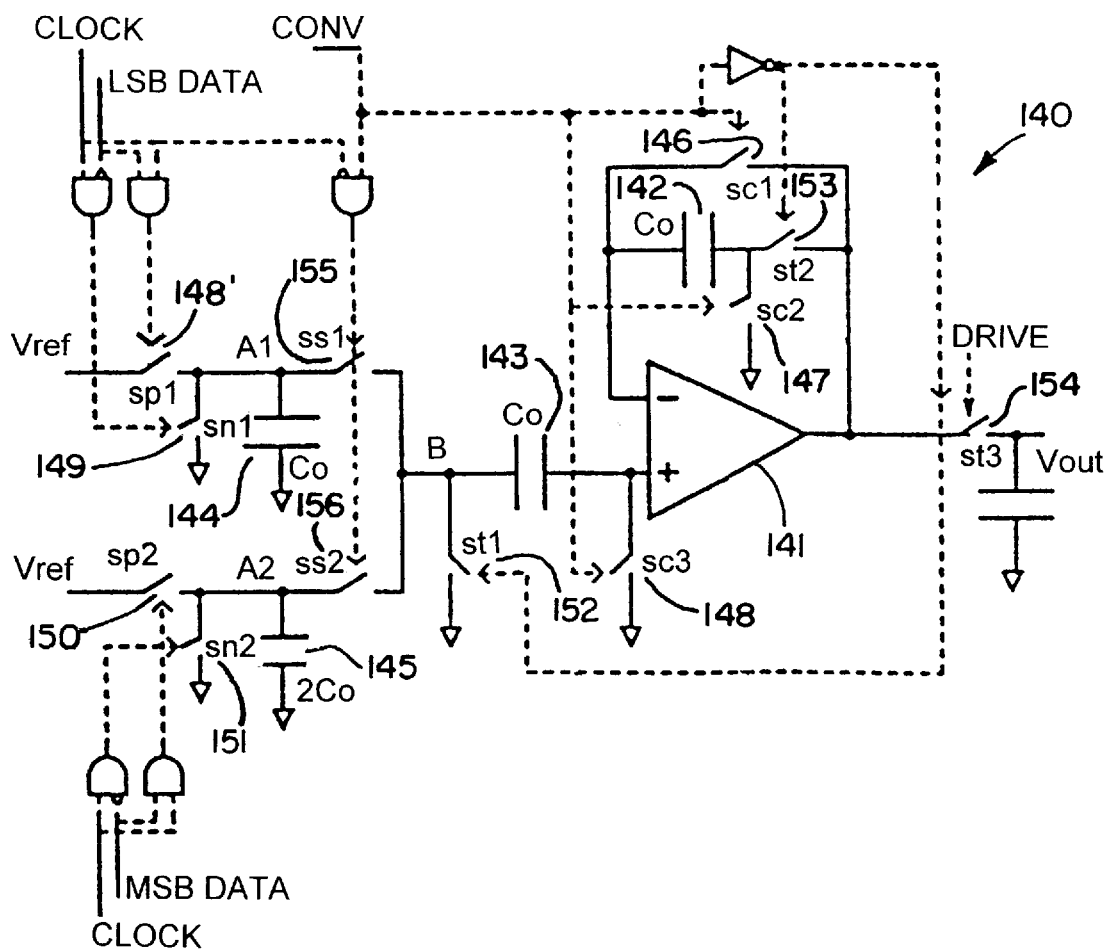
Figure 19A:
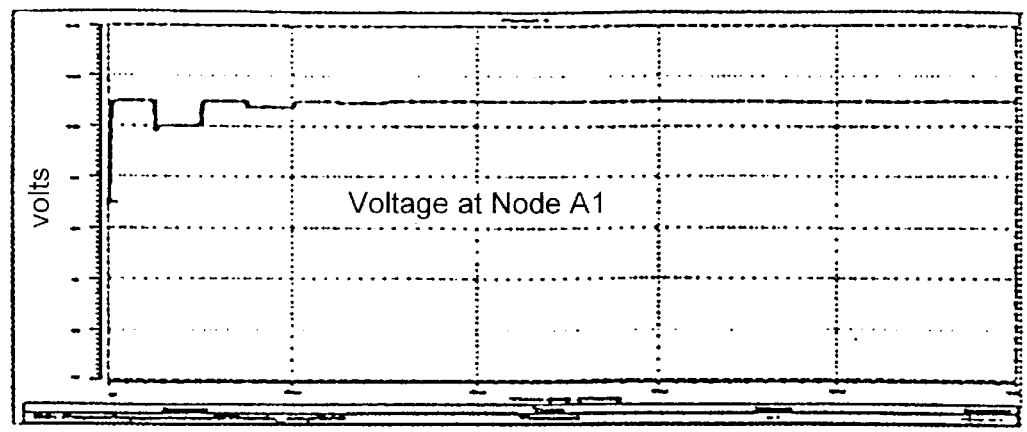
FIGS. 19*a*, 19*b*, 19*c* and 19*d* show a timing diagram of the D/A converter of FIG. 17.
Figure 19B:
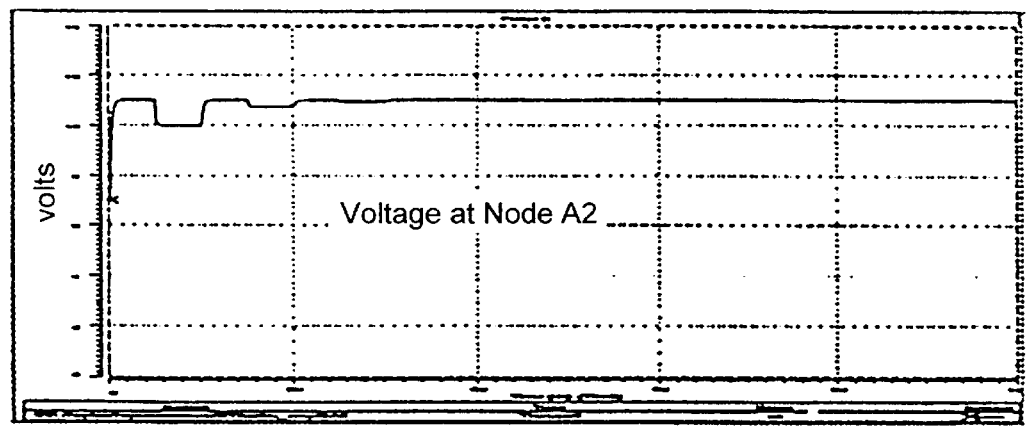
Figure 19C:
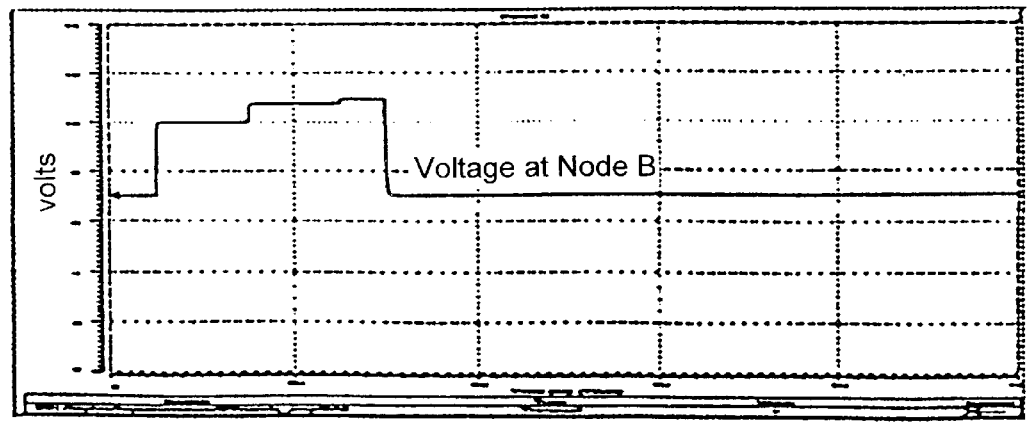
Figure 19D:
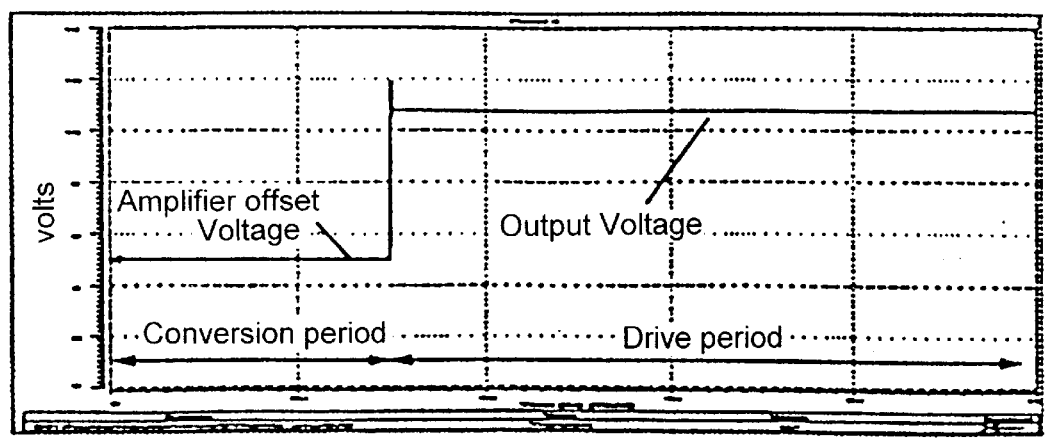

In order to speed up the conversion process, it is possible to convert two data bits at a time utilising a pseudo-serial-base 4 arrangement, and FIG. 16 shows such an arrangement utilizing a sample-shift array 110 having DFF's 111 and associated 2:1 multiplexers 112 arranged so that even bits b0 to bn-2 are clocked out in parallel with odd bits b1 to bn-1. Examples of suitable serial D/A converters 120 and 140 utilising such an arrangement are shown in FIGS. 17 and 18. The D/A converter 120 of FIG. 17 comprises an inverting amplifier 121 and associated capacitors 122, 123, 124 and 125 and switches 126, 127, 128, 129, 130, 131, 132, 133, 134, 135, and 136. The control of the switching sequence is substantially the same as that described above with reference to FIG. 13, although, since two data streams are clocked in parallel, only half the number of clock cycles is needed. The overhead is the relatively modest requirement of an additional capacitor 125 of value 2Co and additional most significant bit (MSB) data control logic for the switches 130 and 131. Substantially the same advantages and disadvantages apply as in the case of the converter of FIG. 13. A corresponding timing diagram for conversion of the data signal DATA=111111 is shown in FIG. 19a (voltage at node A1), FIG. 19b (voltage at node A2), FIG. 19c (voltage at node B) and FIG. 19d (output voltage) with the same voltages as for the timing diagram of FIGS. 15a, 15b and 15c.

The D/A converter 140 of FIG. 18 comprises a differential amplifier 141 and associated capacitors 142, 143, 144 and 145 and switches 146, 147, 148, 148',149, 150, 151, 152, 153, 154, 155 and 156, and the control of the switching sequence in this case is substantially the same as that described with reference to FIG. 14, except that again two data streams are clocked in parallel so that only half the number of clock cycles is required.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. An active matrix digital drive circuit for sampling a digital input signal having n parallel bits and for supplying analogue drive signals to a plurality of lines, the drive circuit comprising:

a control shift register comprising a chain of control shift elements having respective outputs; and a driver stage associated with each of the control shift elements; each respective driver stage arranged so as to sample the input signal for a corresponding one of the lines and to supply a drive signal to the line under the control of the respective control shift element, wherein each of the driver stages incorporates a sample shift register including a chain of n sample shift elements having n inputs and controlled by the control shift register such that, in a sampling mode, the n bits of the input signal are supplied in parallel to the n inputs of the sample shift elements, and, in a shifting mode, the n bits stored by the sample shift elements are shifted along the sample shift register towards at least one output of the sample shift register, and a serial digital-to-analogue converter coupled to said output of the sample shift register for sequentially receiving the bits shifted along the sample shift register and for supplying the analogue drive signal to the corresponding line in dependence thereon.

2. A drive circuit according to claim 1, wherein the control shift register controls sampling of the input signal and supply of drive signals to the lines such that the input signal is sampled for a first group of lines in a first subperiod and corresponding drive signals are supplied to the first group of lines in a second subperiod, and such that the input signal is sampled for a second group of lines in a subperiod which is at least partly coextensive with the second subperiod and corresponding drive signals are supplied to the second group of lines in a further subperiod.

3. A drive circuit according to claim 2, for supplying drive signals in successive line periods to rows of control elements in an active matrix in which the control elements are disposed at the intersections of the lines and the rows, wherein the control shift register controls sampling of the input signal and supply of drive signals to the lines such that the input signal is sampled for a first group of control elements along a row in a first subperiod of one of the line periods and corresponding drive signals are supplied to the first group of control elements in a second subperiod of said one line period, and such that the input signal is sampled for a second group of control elements along the row in the second subperiod of said one line period and corresponding drive signals are supplied to the second group of control elements in a first subperiod of a further one of the line periods following said one line period.

4. A drive circuit according to claim 1, wherein each of the driver stages includes a multiplexing element arranged so as to supply a corresponding bit of the input signal to the input of each sample shift element in the sampling mode and to couple together the inputs and the outputs of the sample shift elements in the shifting mode to permit shifting of the stored bits along the sample shift register.

5. A drive circuit according to claim 4, wherein the multiplexing element includes a respective multiplexer associated with each sample shift element for receiving a corresponding bit of the input signal, and successive sample shift elements of the sample shift register are coupled together by the associated multiplexers to provide for shifting of all the stored bits along the sample shift register in a simple sequence towards the digital-to-analogue converter.

6. A drive circuit according to claim 4, wherein the multiplexing element comprises a respective multiplexer associated with each sample shift element for receiving a corresponding bit of the input signal, a first group of the sample shift elements is coupled together by the associated multiplexers to provide for shifting of the even stored bits along the sample shift register towards a first output of the sample shift register, and a second group of the sample shift elements is coupled together by the associated multiplexers to provide for shifting of the odd stored bits along the sample shift register towards a second output of the sample shift register.

7. A drive circuit according to claim 1, further comprising a first clock element arranged so as to supply first clock signals to the control shift register to effect sampling of the input signals by clocking of the control shift elements at a first rate, and a second clock element arranged so as to supply second clock signals to the sample shift register to effect shifting of the stored bits by clocking of the sample shift elements at a second rate which is less than the first rate.

8. A drive circuit according to claim 1, wherein the sample shift elements are adapted to invert the bits applied to their inputs, and an inverter is provided at said output of the sample shift register for inverting the bits outputted by the sample shift register prior to their application to the digital-to-analogue converter.

9. A drive circuit according to claim 1, wherein the digital-to-analogue converter includes a capacitance element arranged so as to store a cumulative voltage due to the serial application of the bits of the sampled input signal outputted by the sample shift register to the capacitance element in a conversion mode, and a switch element arranged so as to transfer the stored voltage to the output of the digital-to-analogue converter in a drive mode after receipt of all the bits of the sampled input signal.

10. A drive circuit according to claim 1, wherein the digital-to-analogue converter comprises a respective buffer arranged so as to output the drive signal to each line.

11. A drive circuit according to claim 10, wherein the buffer incorporates an input capacitor for storing the voltage due to the serial application of the bits of the sampled input signal outputted by the sample shift register.

12. A drive circuit according to claim 10, wherein the buffer includes an amplifier and a compensating capacitance connected across the amplifier and arranged to store an initial offset voltage of the amplifier in a conversion mode and to apply the stored offset voltage as negative feedback in a drive mode.

13. A drive circuit according to claim 12, wherein the amplifier is an inverting amplifier.

14. A drive circuit according to claim 12, wherein the amplifier is a differential amplifier.

15. An active matrix liquid crystal display incorporating a drive circuit according to claim 1.

16. A drive circuit according to claim 15, wherein the drive circuit is implemented using thin-film transistors integrated on a display substrate.

17. A drive circuit according to claim 16, wherein the transistors are polysilicon thin film transistors.

* * * * *